United States Patent
Lin et al.

(10) Patent No.: US 12,080,607 B2
(45) Date of Patent: *Sep. 3, 2024

(54) STRUCTURE AND METHOD FOR FINFET DEVICE WITH SOURCE/DRAIN MODULATION

(71) Applicant: Taiwan Semiconductor Manufacturing Company, Ltd., Hsin-Chu (TW)

(72) Inventors: Ta-Chun Lin, Hsinchu (TW); Kuo-Hua Pan, Hsinchu (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/321,188

(22) Filed: May 22, 2023

(65) Prior Publication Data

US 2023/0307299 A1   Sep. 28, 2023

Related U.S. Application Data

(63) Continuation of application No. 17/225,904, filed on Apr. 8, 2021, now Pat. No. 11,658,074.

(51) Int. Cl.
*H01L 21/8238* (2006.01)
*H01L 21/265* (2006.01)
(Continued)

(52) U.S. Cl.
CPC .......... *H01L 21/823814* (2013.01); *H01L 21/26513* (2013.01); *H01L 21/26586* (2013.01);
(Continued)

(58) Field of Classification Search
CPC ....... H01L 21/823814; H01L 21/26513; H01L 21/26586; H01L 21/266; H01L 21/30604;
(Continued)

(56) References Cited

U.S. PATENT DOCUMENTS 8,836,016 B2   9/2014   Wu et al.
8,841,701 B2   9/2014   Lin et al.
(Continued)

*Primary Examiner* — Karen Kusumakar
*Assistant Examiner* — Adam S Bowen
(74) *Attorney, Agent, or Firm* — HAYNES AND BOONE, LLP

(57) ABSTRACT

The present disclosure provides a fabrication method that includes providing a workpiece having a semiconductor substrate with a first circuit area and a second circuit area; forming a first active region within the first circuit area and a second active region within the second circuit area; forming a first gate structure on the first active region and a second gate structure on the second active region; introducing a doping species to the first active region but not the second active region; performing an etching process, thereby simultaneously recessing both first source/drain regions of the first active region and second source/drain regions of the second active region at a same etch rate; and thereafter, epitaxially growing first source/drain features within the first source/drain regions and second source/drain features within the second source/drain regions.

20 Claims, 33 Drawing Sheets

(51) Int. Cl.
    *H01L 21/266* (2006.01)
    *H01L 21/306* (2006.01)
    *H01L 21/308* (2006.01)
    *H01L 27/092* (2006.01)
    *H01L 29/08* (2006.01)
    *H01L 29/167* (2006.01)
    *H01L 29/66* (2006.01)
    *H01L 29/78* (2006.01)

(52) U.S. Cl.
    CPC ...... *H01L 21/266* (2013.01); *H01L 21/30604* (2013.01); *H01L 21/308* (2013.01); *H01L 21/823821* (2013.01); *H01L 21/823828* (2013.01); *H01L 21/823864* (2013.01); *H01L 27/0924* (2013.01); *H01L 29/0847* (2013.01); *H01L 29/167* (2013.01); *H01L 29/66545* (2013.01); *H01L 29/66636* (2013.01); *H01L 29/66795* (2013.01); *H01L 29/7851* (2013.01)

(58) Field of Classification Search
    CPC ........... H01L 21/308; H01L 21/823821; H01L 21/823828; H01L 21/823864; H01L 27/0924; H01L 29/0847; H01L 29/167; H01L 29/66545; H01L 29/66636; H01L 29/66795; H01L 29/7851; H01L 29/165; H01L 21/823842; H01L 21/823857; H01L 29/7848; H01L 21/3065; H01L 21/823418; H01L 21/823431
    See application file for complete search history.

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 10,332,819 B1* | 6/2019 | Liaw ................ H01L 29/66007 |
| 2015/0262886 A1* | 9/2015 | Nieh ................ H01L 29/7834 438/296 |

* cited by examiner

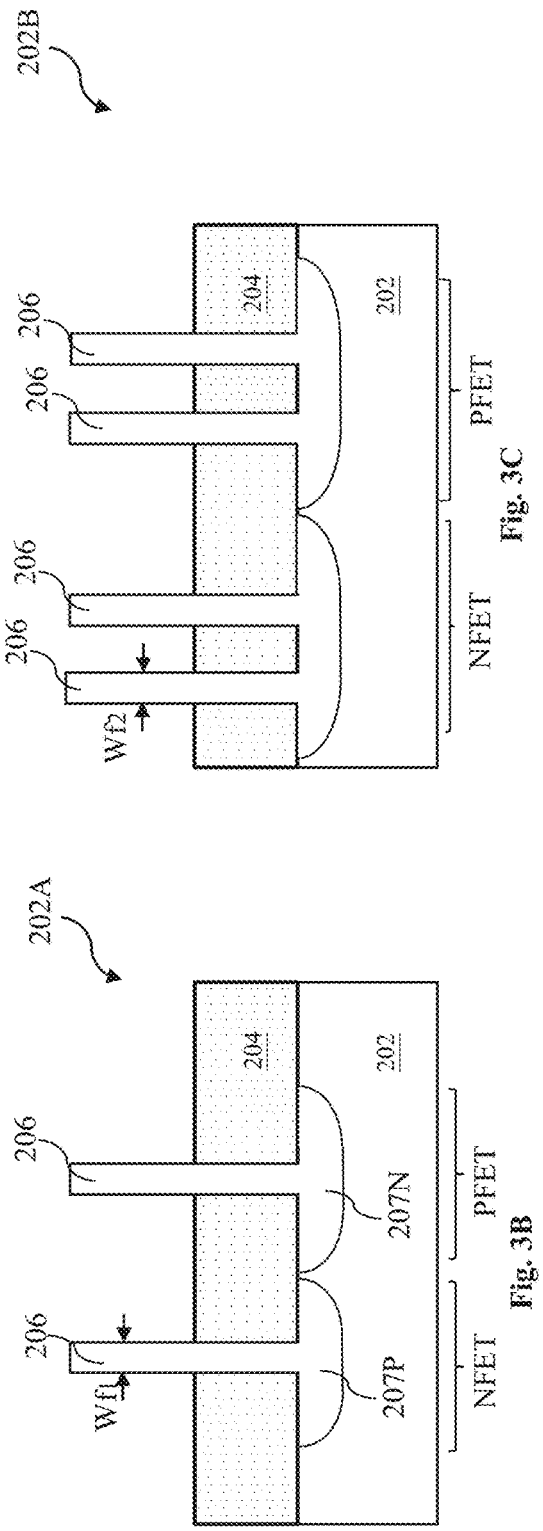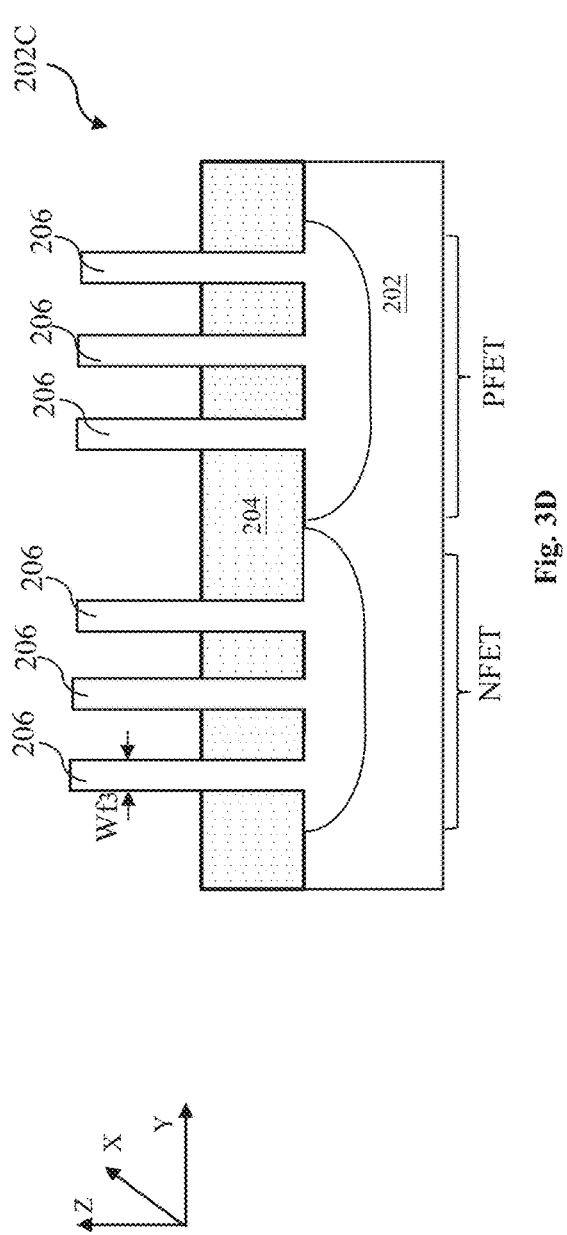

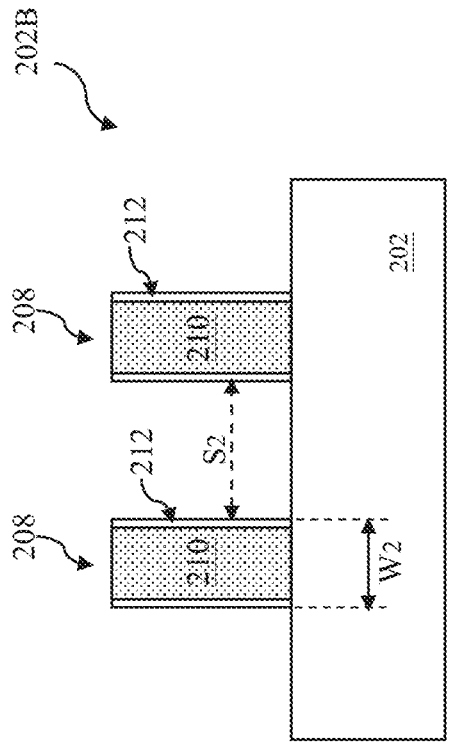
Fig. 4B
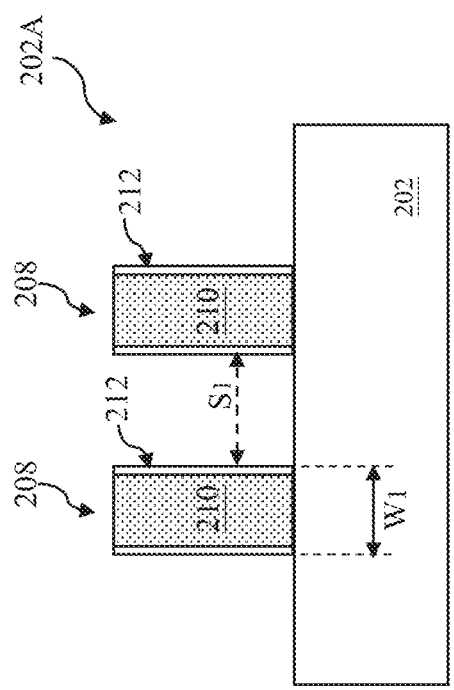
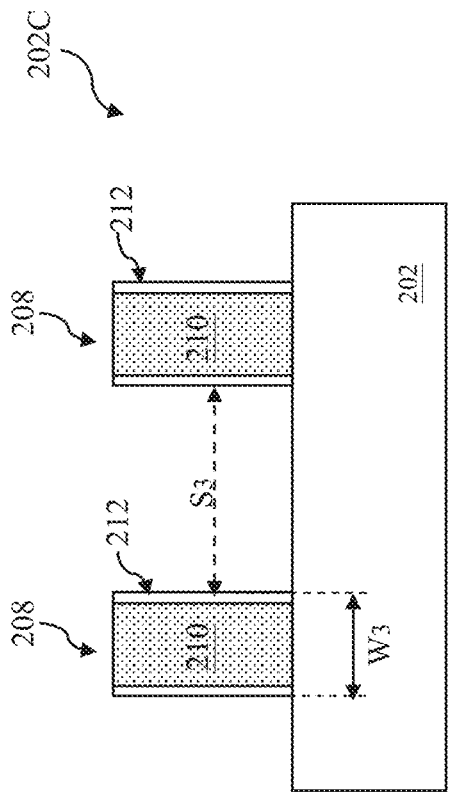
Fig. 4C
Fig. 4D
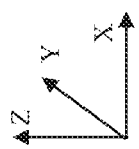

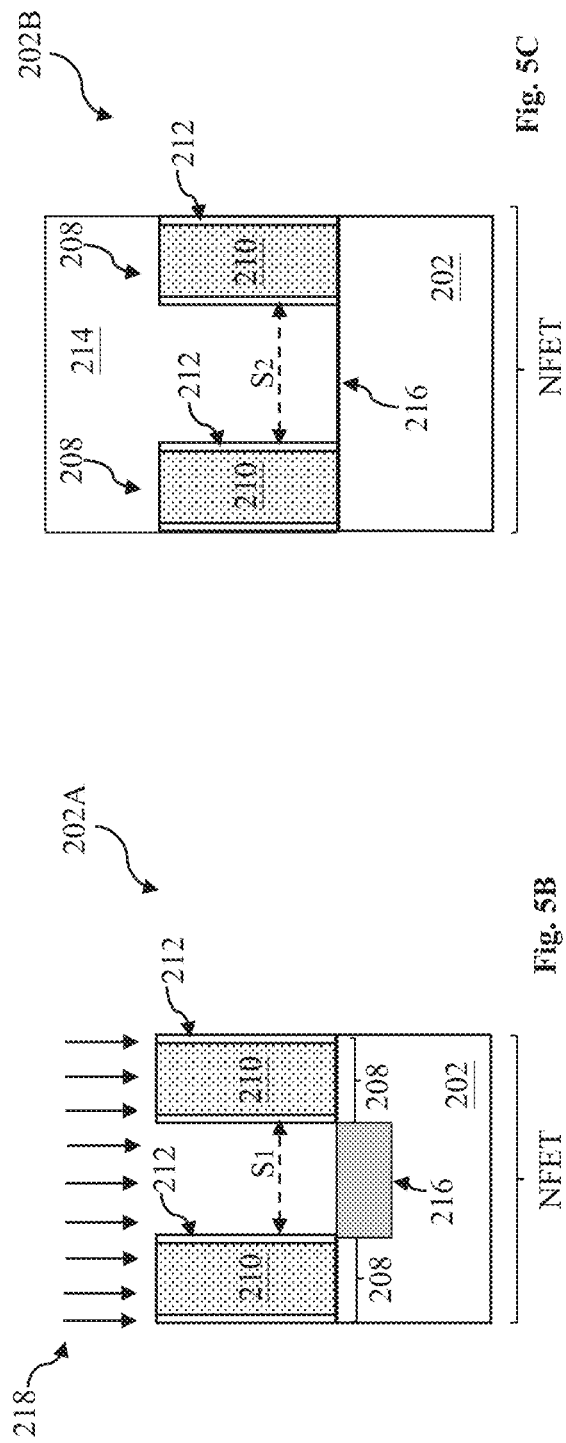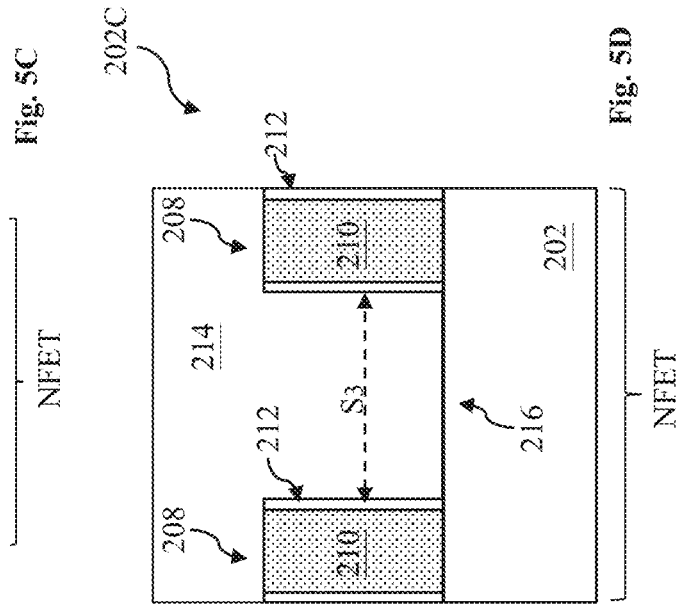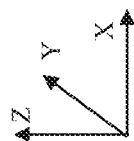

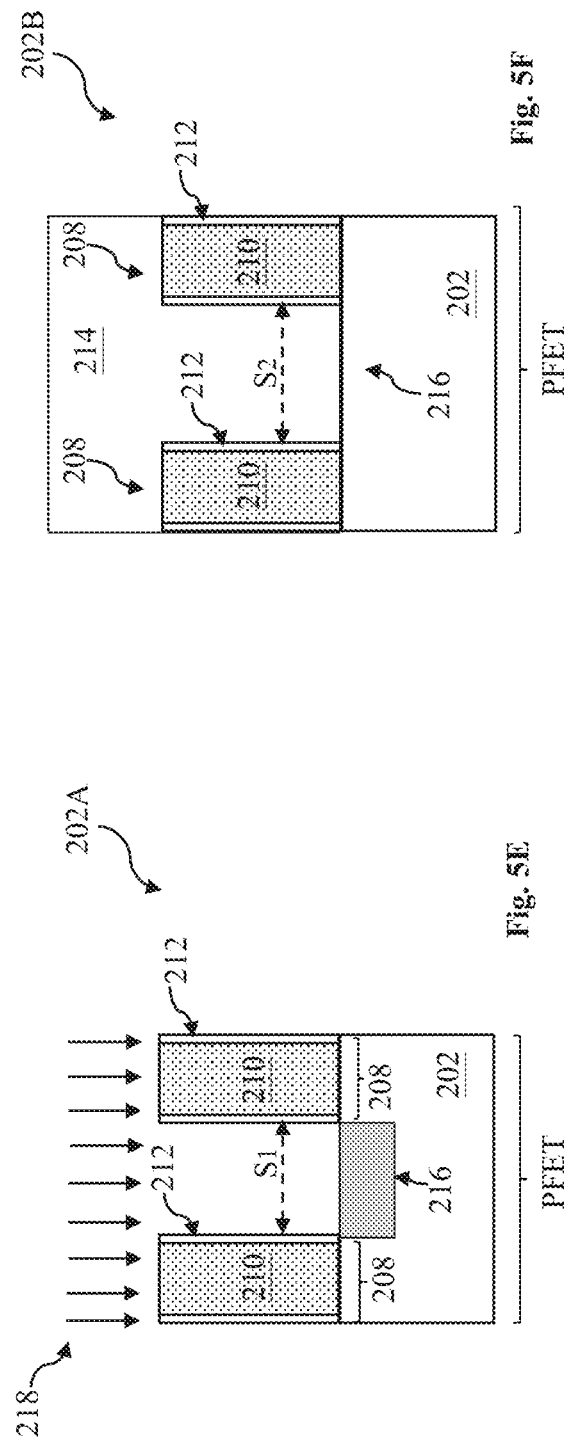
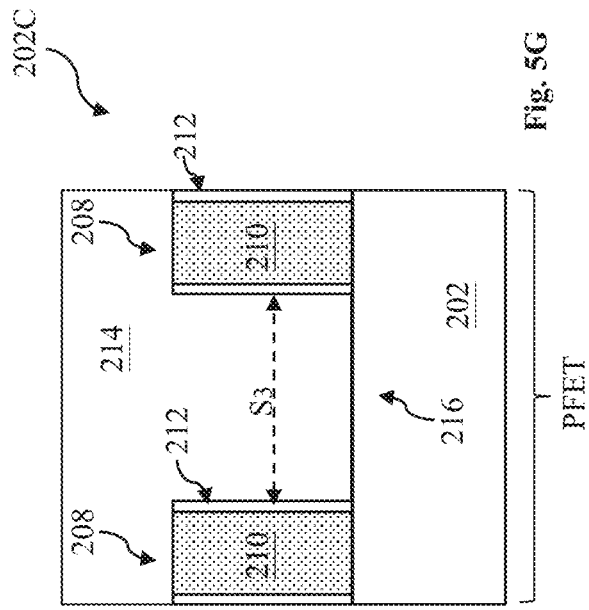
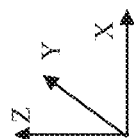
Fig. 5E
Fig. 5F
Fig. 5G

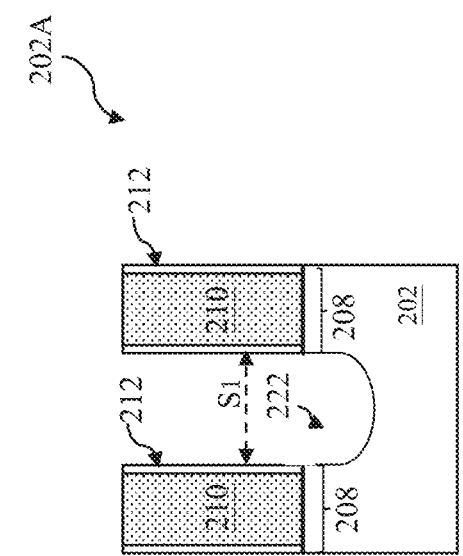
Fig. 6B
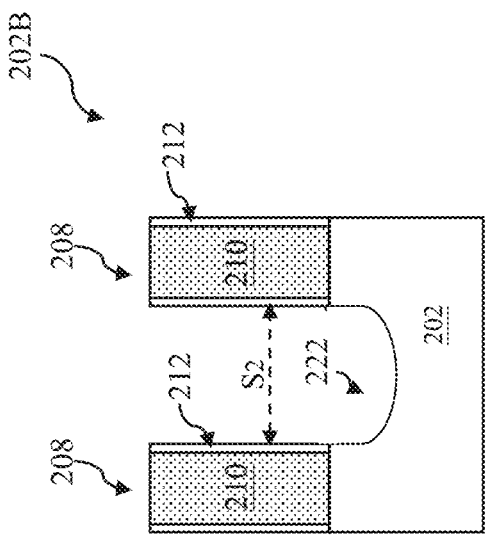
Fig. 6C
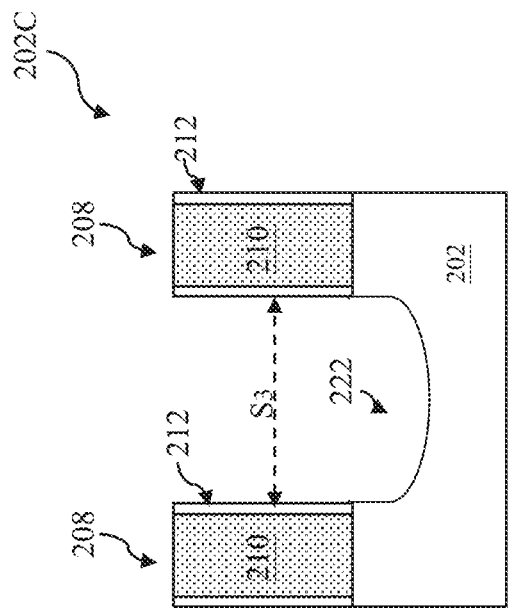
Fig. 6D
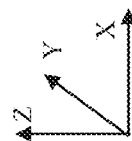

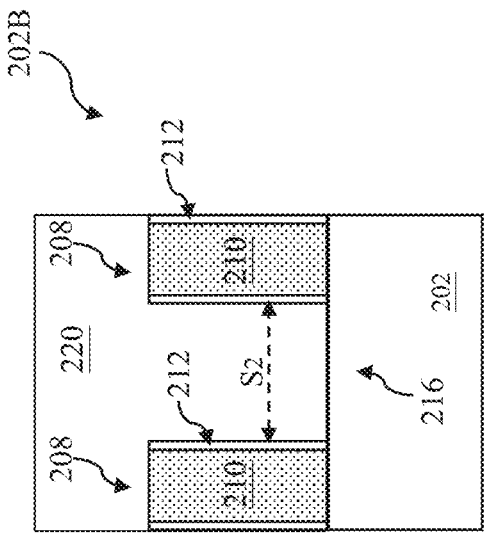
Fig. 6E
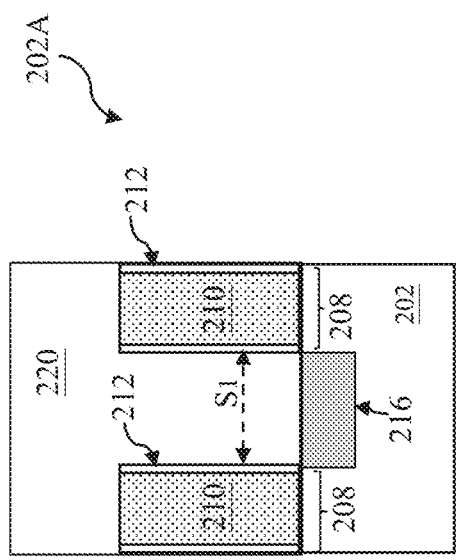
Fig. 6F
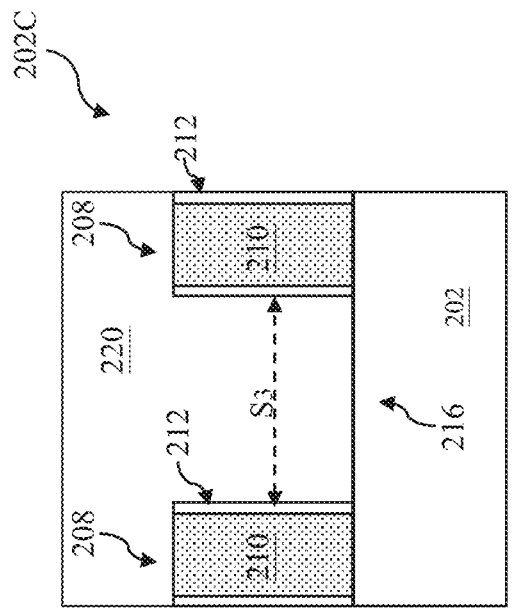
Fig. 6G
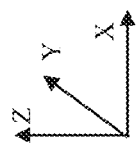

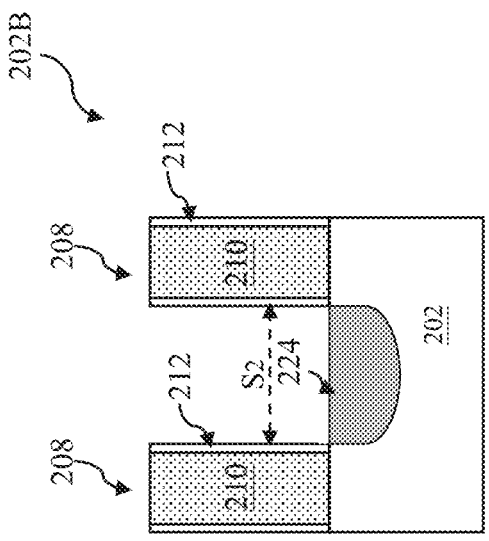
Fig. 7B
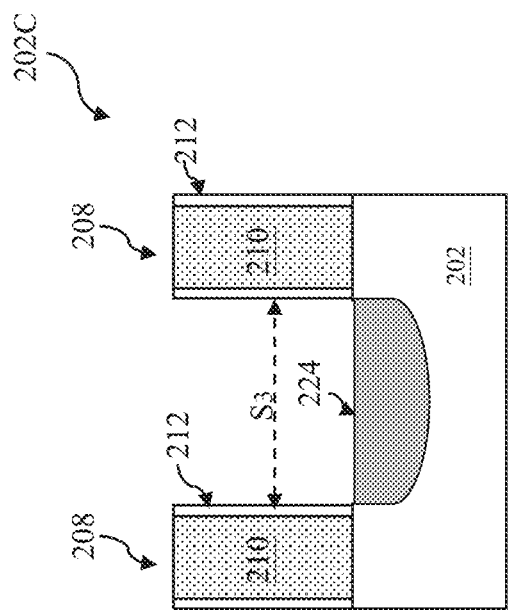
Fig. 7C
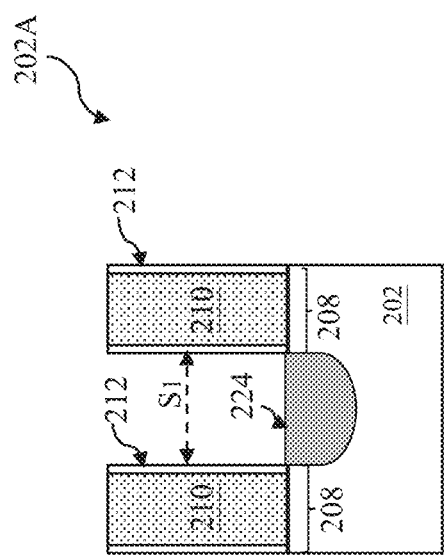
Fig. 7D
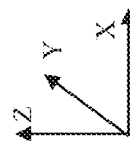

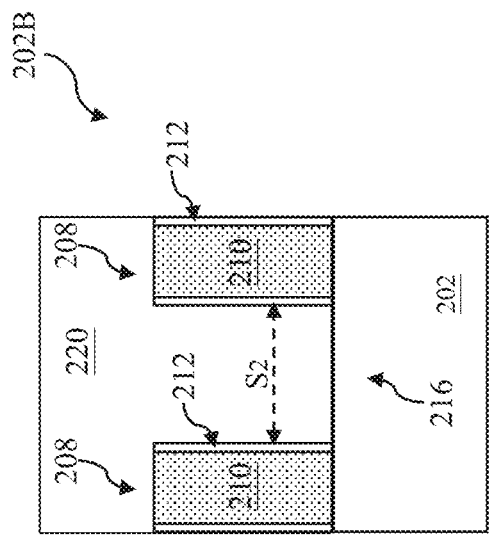
Fig. 7F
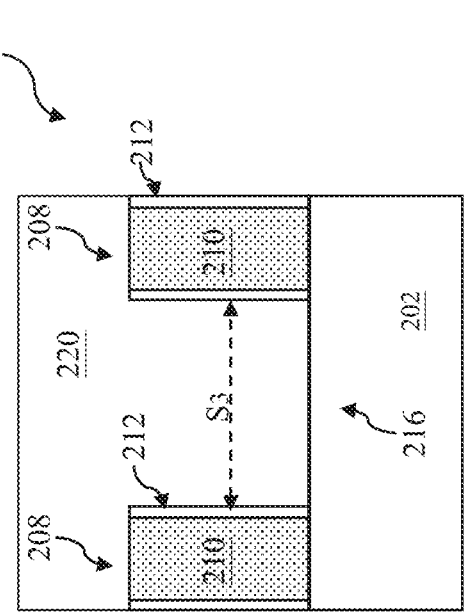
Fig. 7G
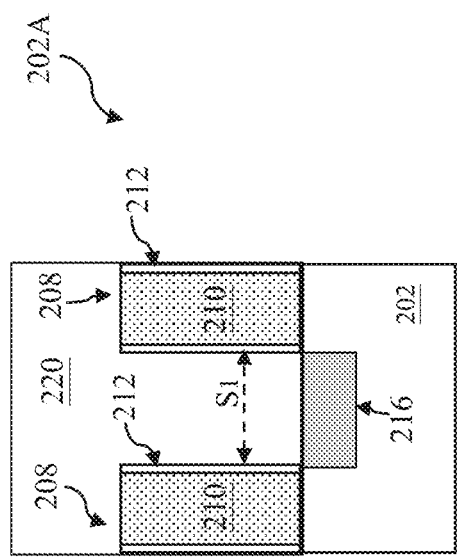
Fig. 7E
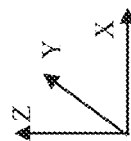

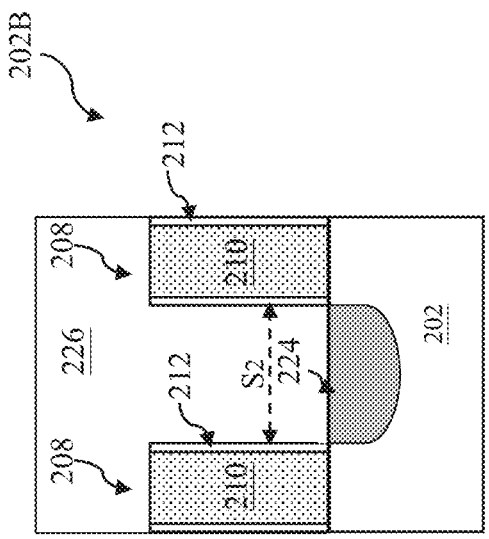
Fig. 8B
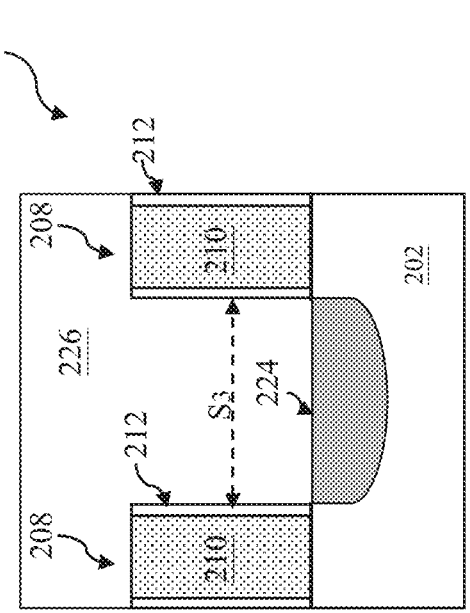
Fig. 8C
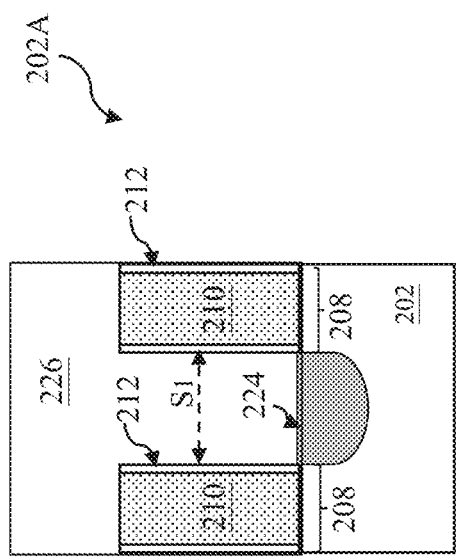
Fig. 8D
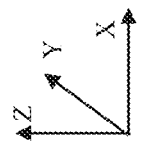

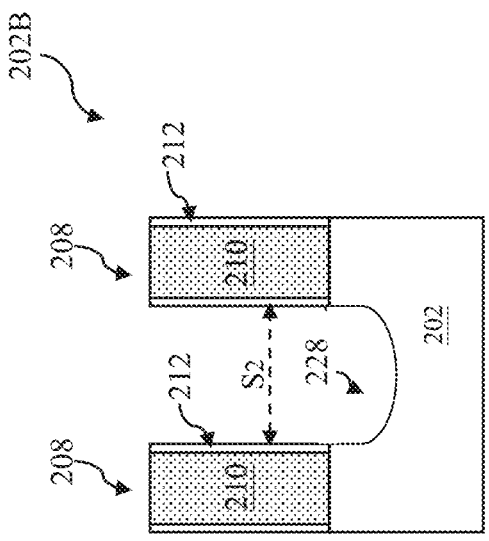
Fig. 8E
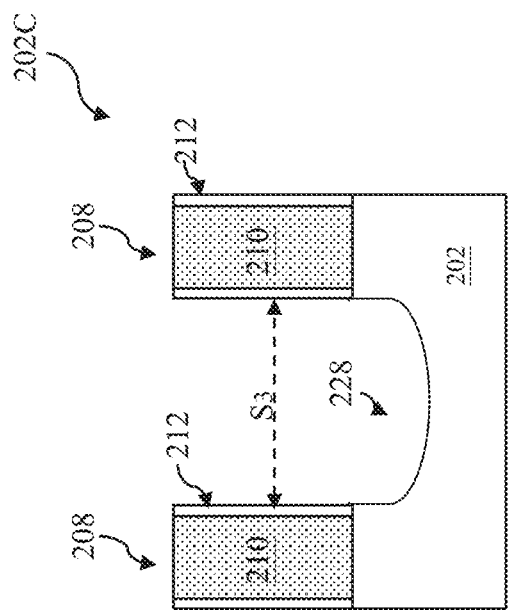
Fig. 8G
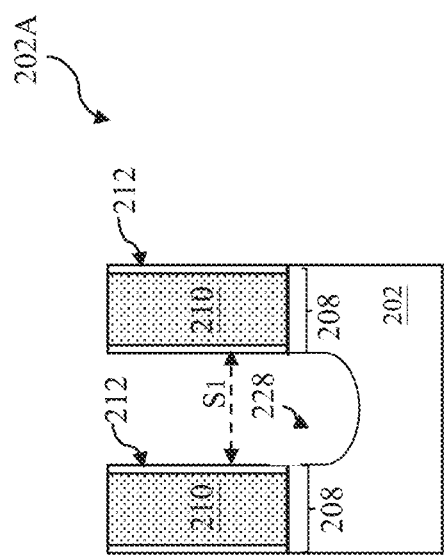
Fig. 8F
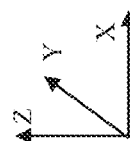

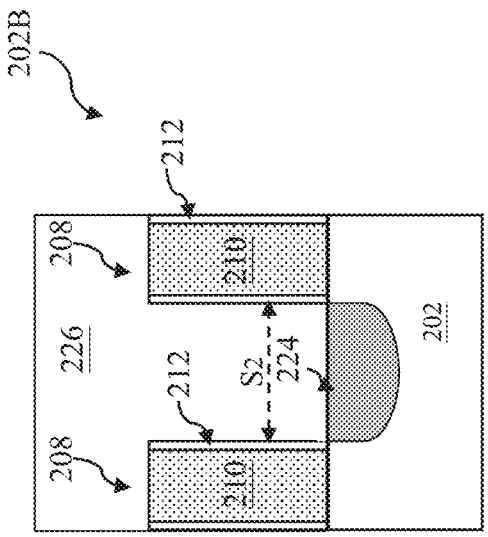
Fig. 9B
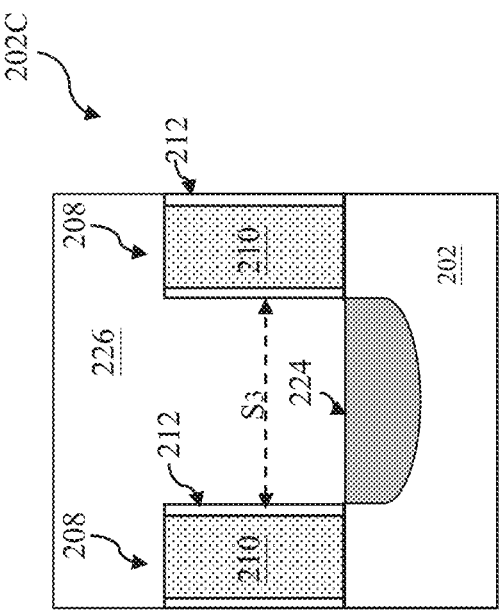
Fig. 9C
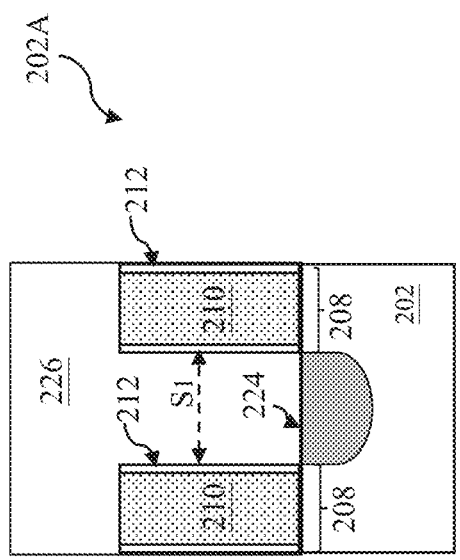
Fig. 9D
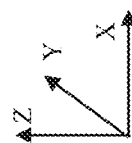

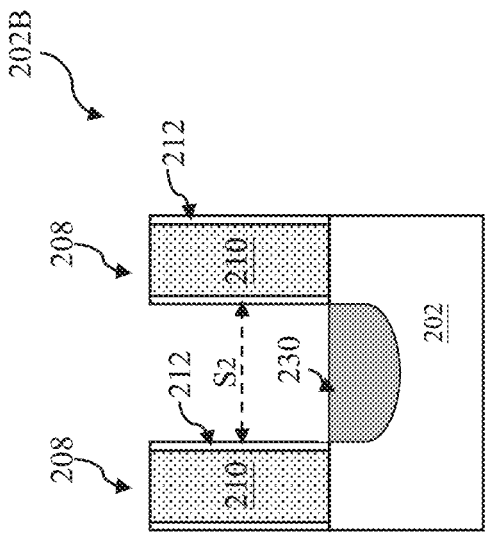
Fig. 9E
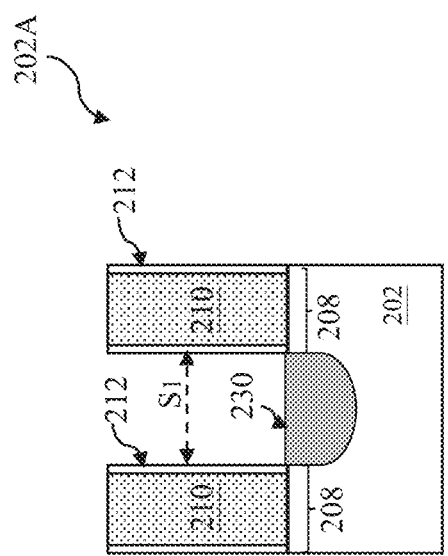
Fig. 9F
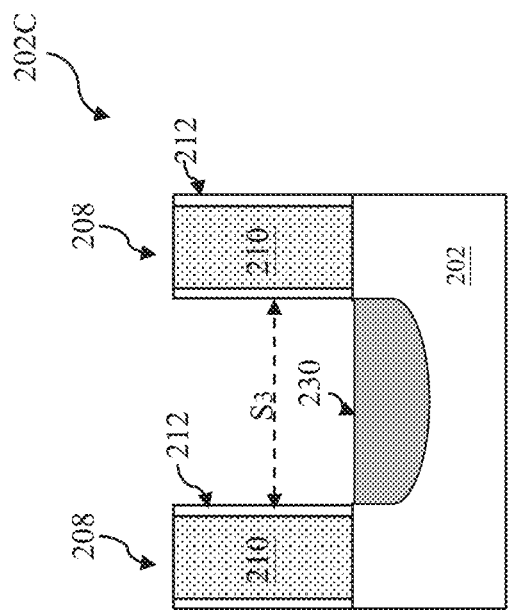
Fig. 9G
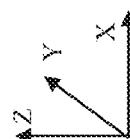

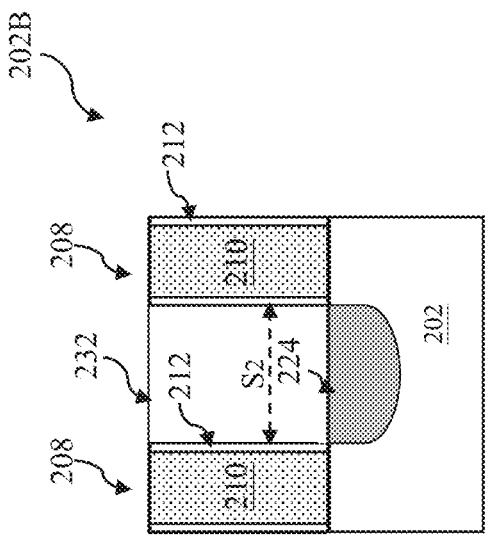
Fig. 10B
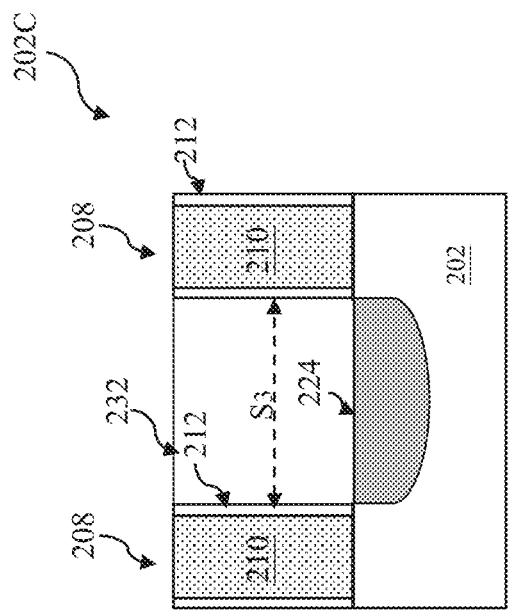
Fig. 10C
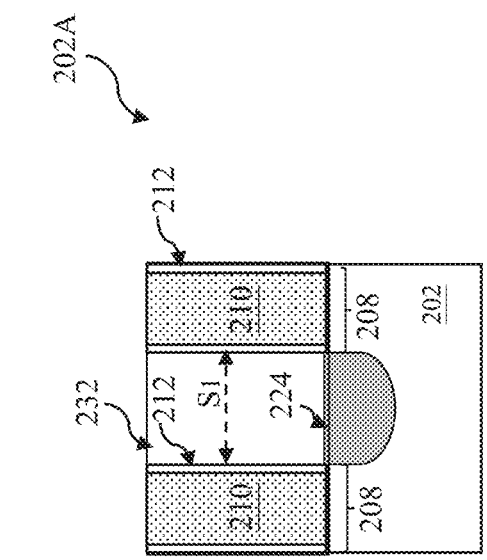
Fig. 10D
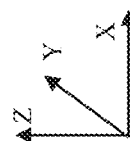

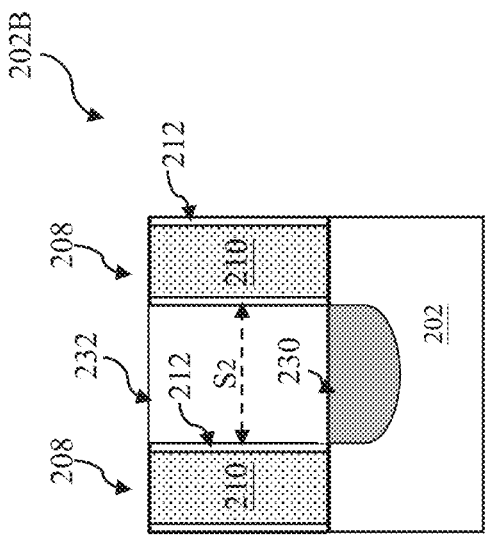
Fig. 10F
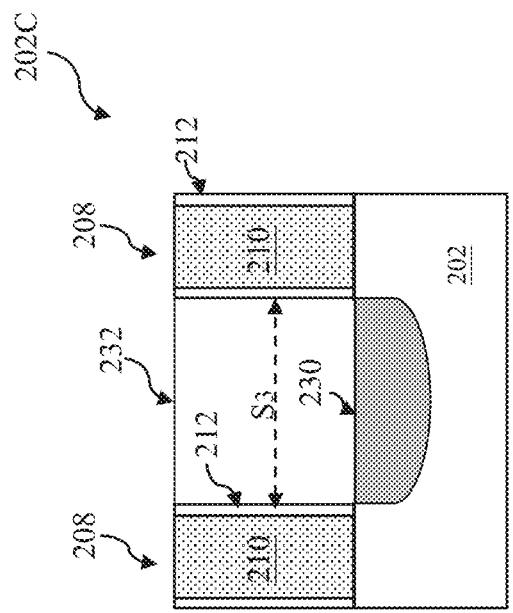
Fig. 10G
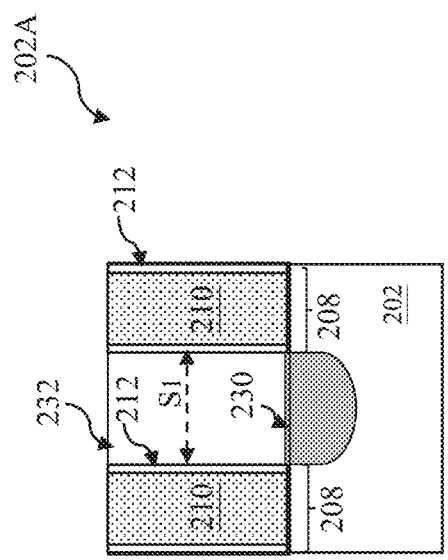
Fig. 10E
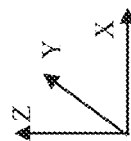

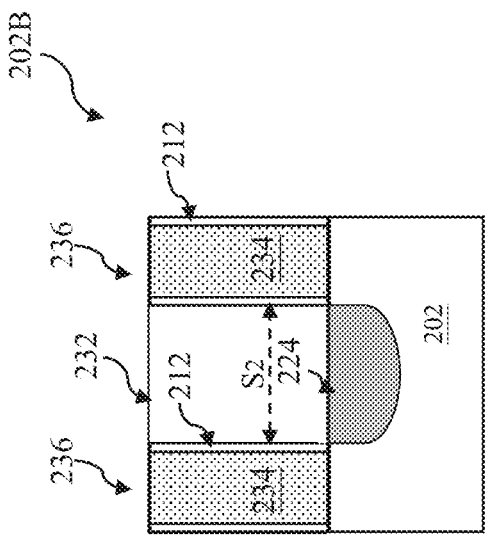
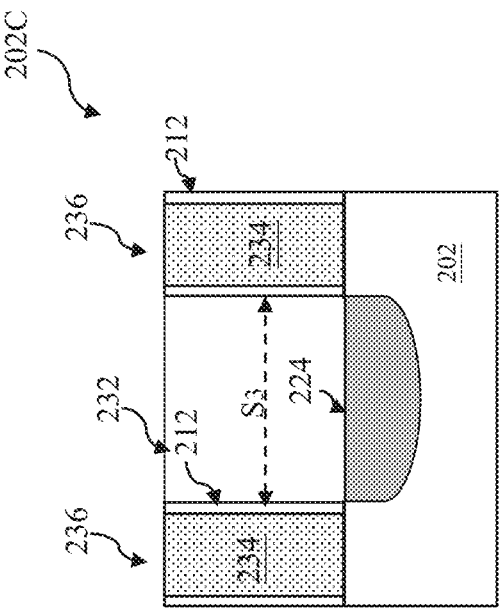
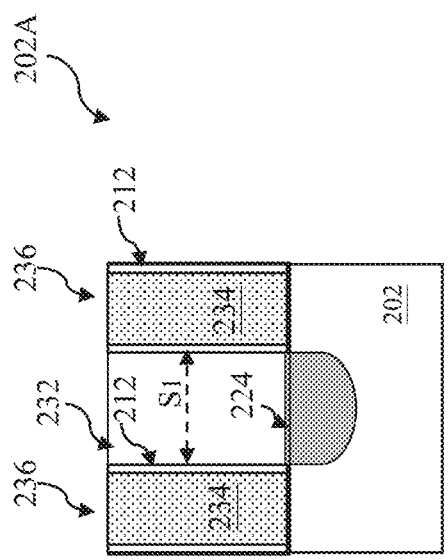

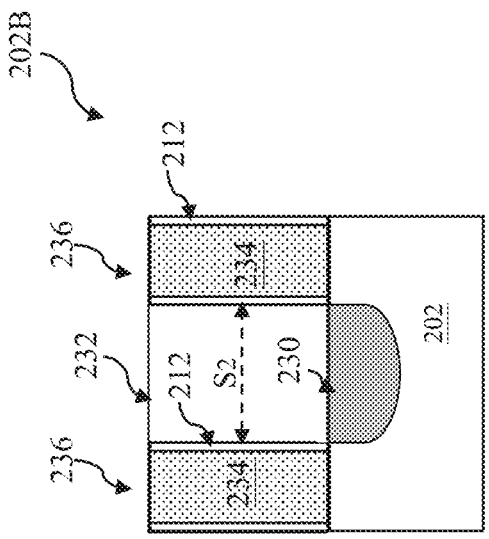
Fig. 11E
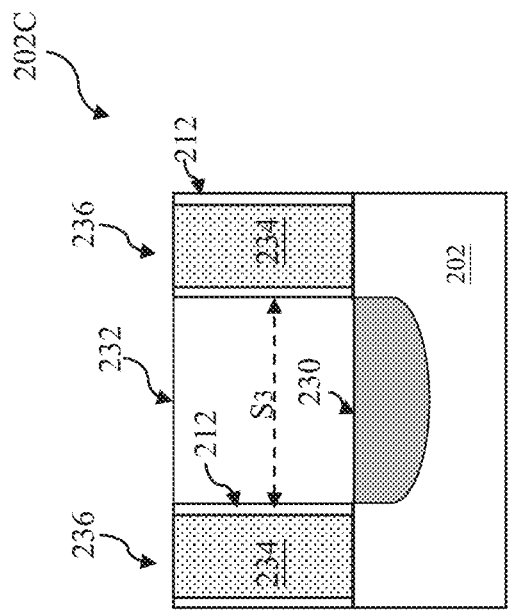
Fig. 11F
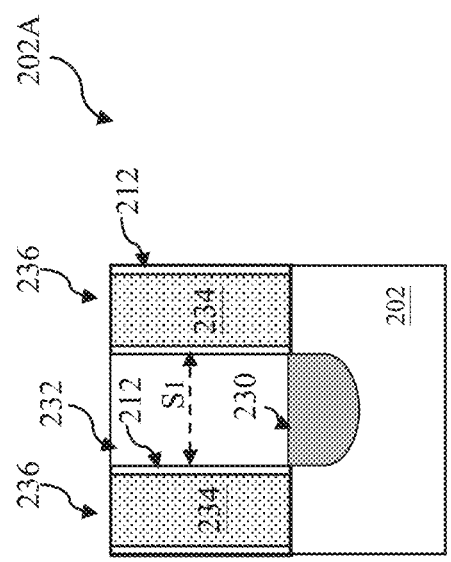
Fig. 11G
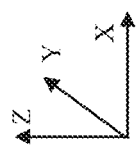

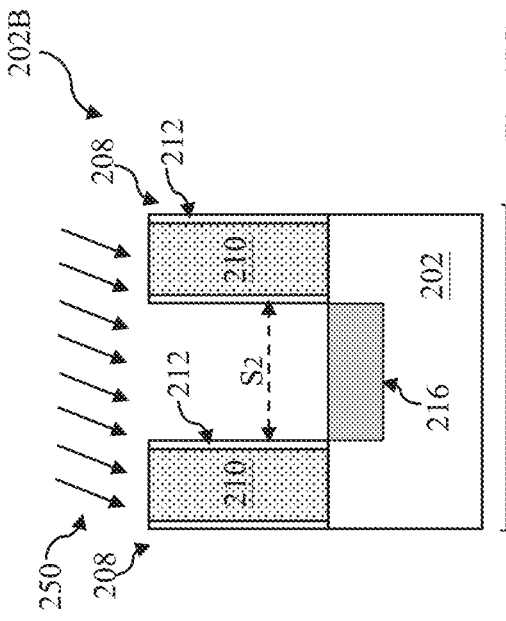
Fig. 15B
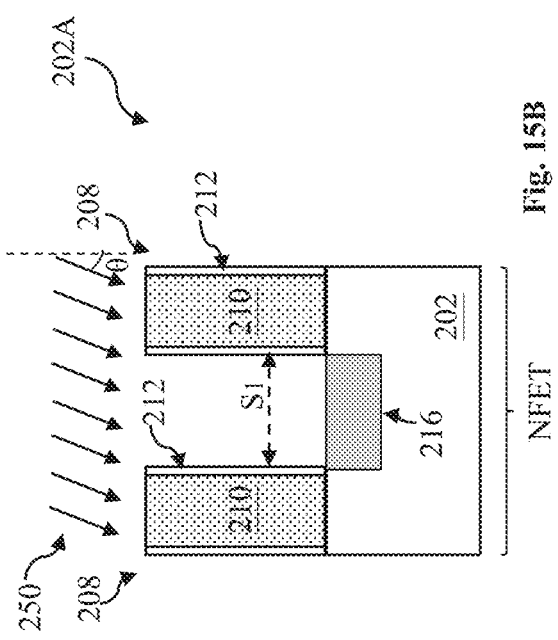
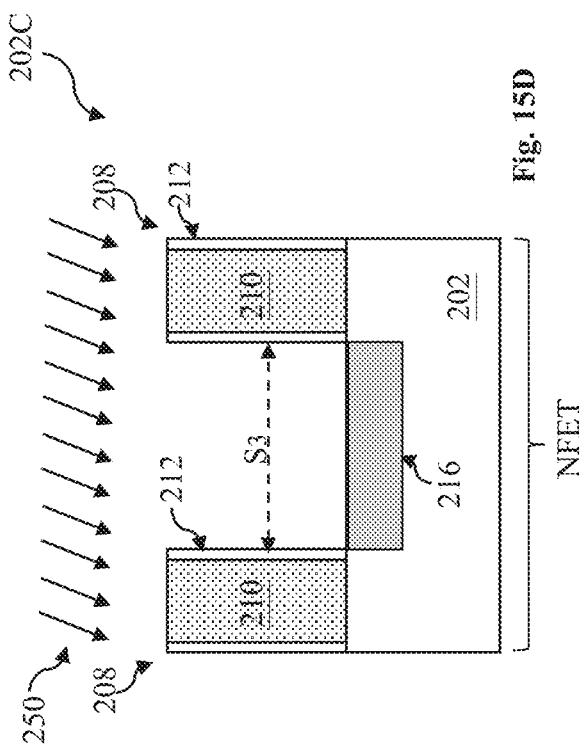
Fig. 15C
Fig. 15D
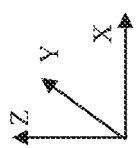

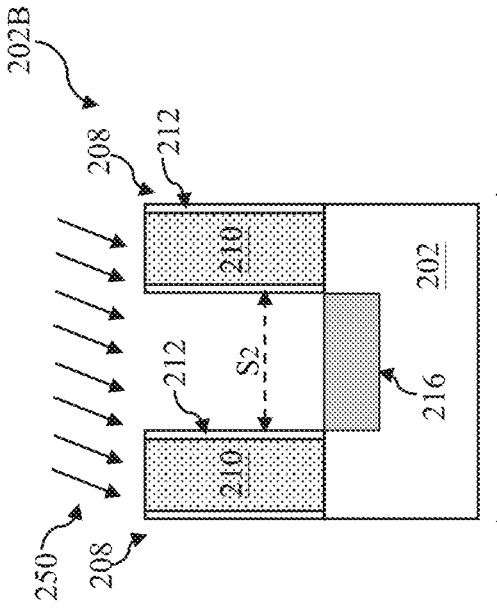
Fig. 15E
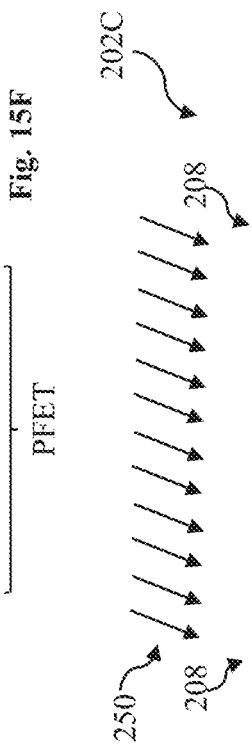
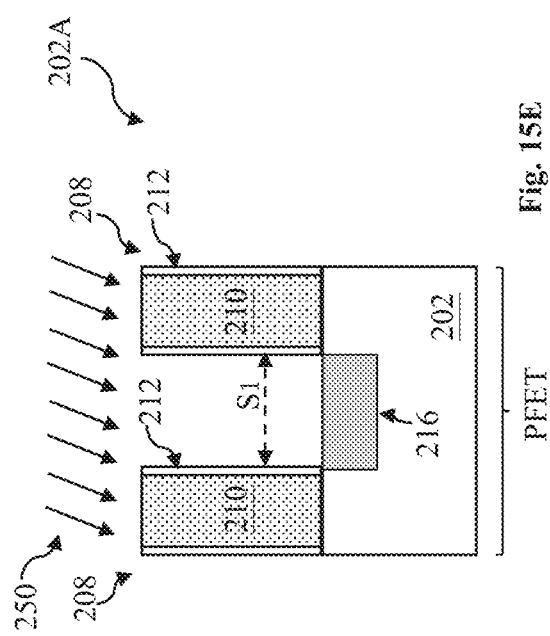
Fig. 15F
Fig. 15G

STRUCTURE AND METHOD FOR FINFET DEVICE WITH SOURCE/DRAIN MODULATION

CROSS-REFERENCE TO RELATED APPLICATIONS

This is a continuation application of U.S. patent application Ser. No. 17/225,904, filed on Apr. 8, 2021, the entire disclosure of which is herein incorporated by reference.

BACKGROUND

Integrated circuits have progressed to advanced technologies with smaller feature sizes, such as 16 nm, 9 nm 7 nm, 5 nm and 3 nm. In these advanced technologies, the devices (such as field-effect transistors) shrink and therefore induce various issues. For examples, the dimensional variation of source/drain features causes short channel issues, junction leakage and variations on source/drain resistance, parasitic capacitance and transistor on-current. This eventually impacts circuit design targets (including power, performance and circuit packing density), device across-chip uniformity and fabrication margin. Therefore, there is a need for a structure and method for integrated circuit of field-effect transistors with source/drain feature to address these concerns for enhanced circuit performance and fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3B, 3C, 3D, 4B, 4C and 4D are sectional views of the semiconductor structure at various fabrication stages constructed according to various embodiments.

FIGS. 5B, 5C, 5D, 5E, 5F, 5G, 6B, 6C, 6D, 6E, 6F, 6G, 7B, 7C, 7D, 7E, 7F, 7G, 8B, 8C, 8D, 8E, 8F, 8G, 9B, 9C, 9D, 9E, 9F, 9G, 10B, 10C, 10D, 10E, 10F, 10G, 11B, 11C, 11D, 11E, 11F, and 11G are sectional views of the semiconductor structure at various fabrication stages constructed according to some embodiments.

FIGS. 15B, 15C, 15D, 15E, 15F, and 15G are sectional views of the semiconductor structure constructed according to some embodiments.

DETAILED DESCRIPTION

Figure 1:
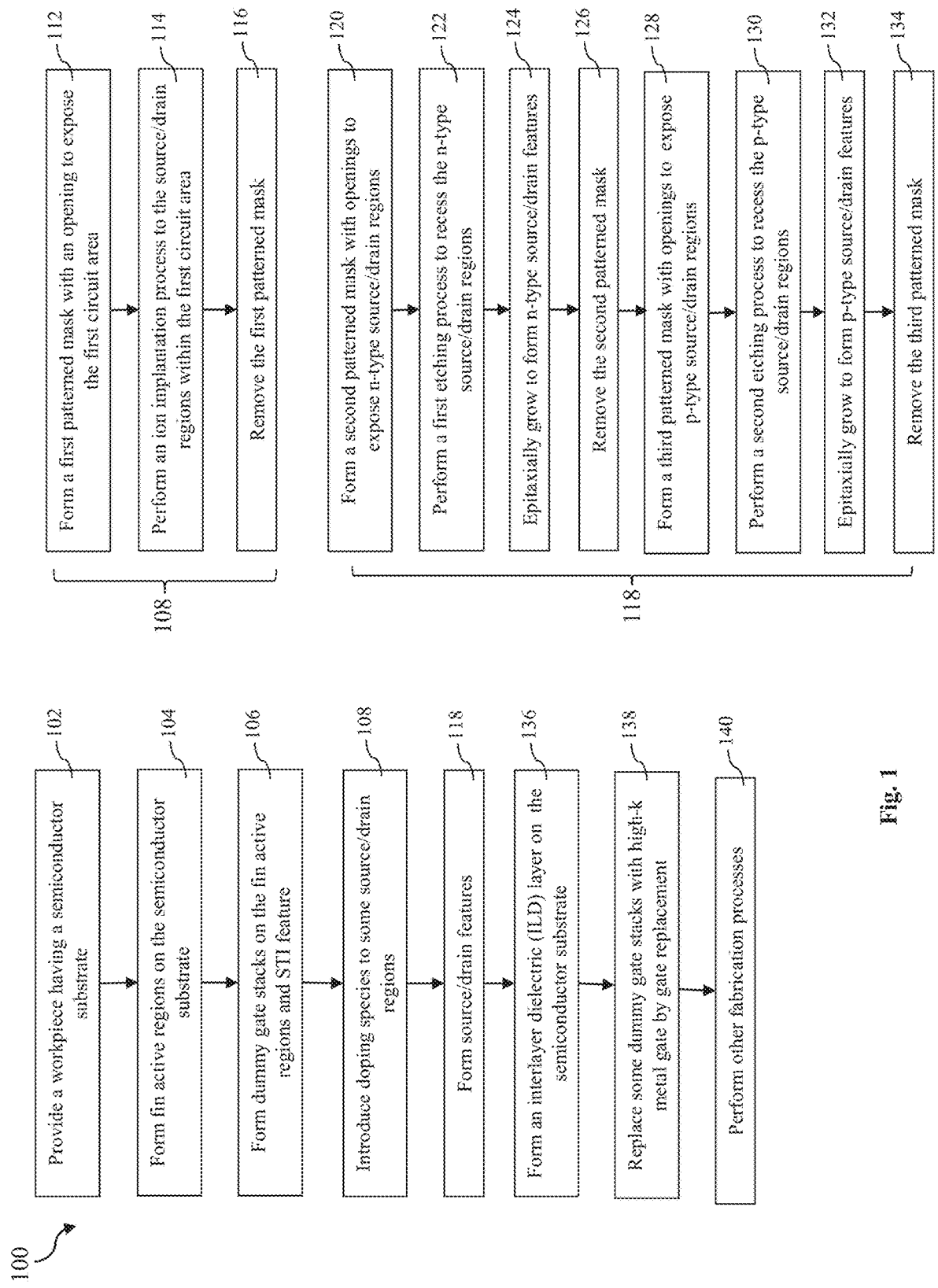
FIG. 1 is a flowchart of a method making a semiconductor structure constructed according to various aspects of the present disclosure in some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to field-effect transistors (FETs) and fabrication methods, and more particularly to various circuits including high-scaling devices, high speed devices and IO devices. The devices of the circuits include planar transistors, or multi-gate transistors, such as fin FETs (FinFETs) or multiple-channel-stacked FETs. In some examples, the multiple-channel-stacked FETs include gate-all-around (GAA) FETs. In following descriptions, FinFETs are used to illustrate the method and the structure made by the method. However, it is not limiting. The method and structure are also applicable to planar FETs, multiple-channel-stacked FETs, or other suitable devices.

The disclosed method includes performing an ion implantation process to introduce one or more doping species into source/drain (S/D) regions of a subset of a circuit, thereby varying etch rate of the corresponding S/D regions. thus, during an etching process to recess the S/D regions, the implanted S/D regions have a modified etch rate. The recessing depths are modified to even depth or respective depth, and the FETs in different circuit regions are optimized with desired height of the S/D features with improved circuit performance or improved circuit power, performance, area and cost (PPAC).

FIG. 1 is a flowchart of a method 100 for fabricating a semiconductor structure (or a workpiece) 200 having various circuit areas with respective FETs constructed according to some embodiments. FIGS. 2A-12B are top or sectional views of the semiconductor structure 200 at various fabrication stages. In the present embodiment, the semiconductor structure 200 includes fin FETs. The semiconductor structure 200 and the method 100 making the same are collectively described below with reference to FIGS. 1 through 12.

Figure 2:
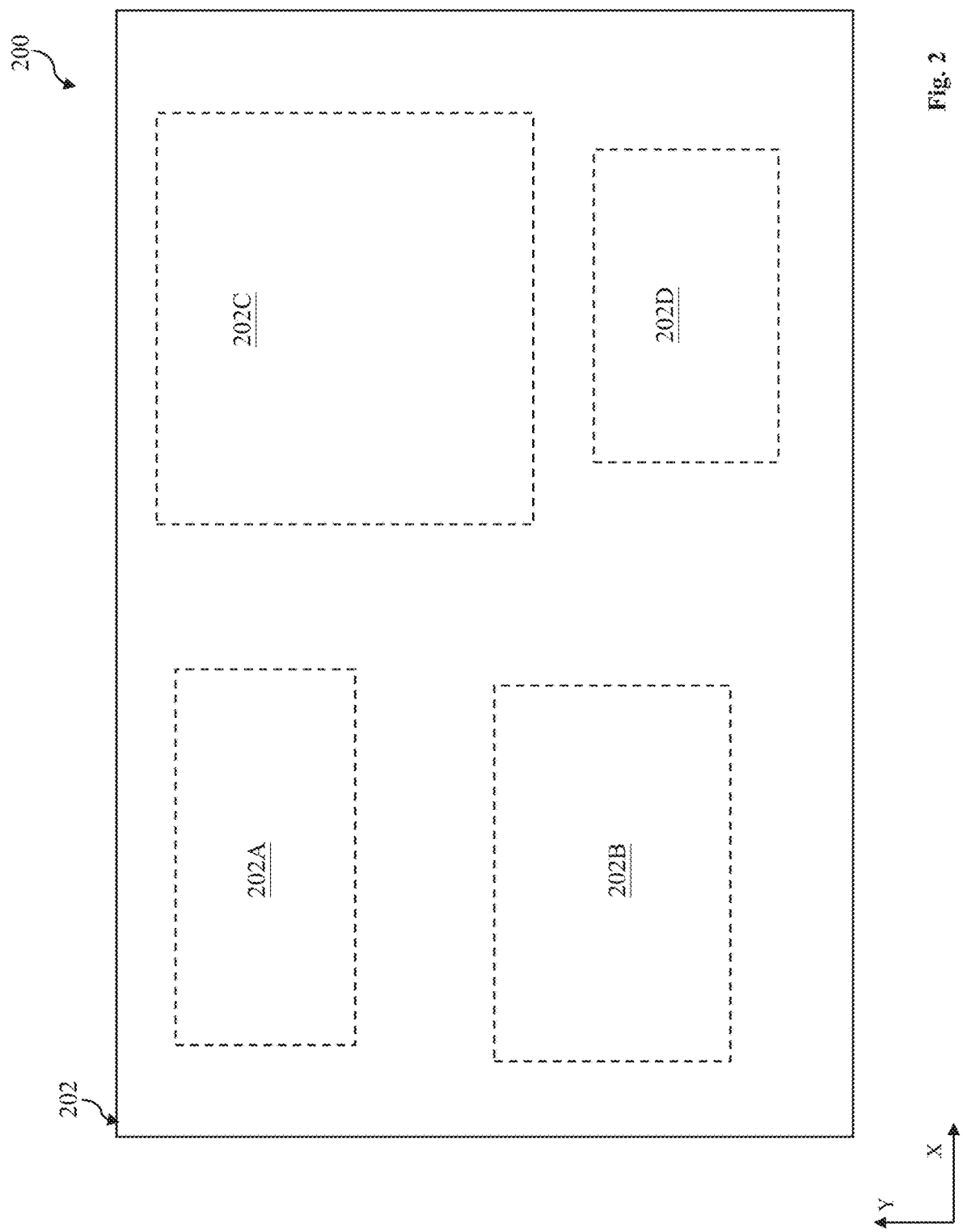
FIG. 2 is a top view of the semiconductor structure constructed according to various embodiments.

Referring to FIG. 2, the method 100 begins with block 102 by providing a workpiece 200 including a semiconductor substrate 202. FIG. 2 is a top view of the workpiece 200, in portion, according to some embodiments. The workpiece 200 includes a semiconductor substrate 202. The semiconductor substrate 202 includes silicon. In some other embodiments, the substrate 202 includes germanium, silicon germanium or other proper semiconductor materials. The substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 202 also includes various doped regions such as n-well and p-wells. In one embodiment, the semiconductor substrate 202 includes an epitaxy (or epi) semiconductor layer. In another embodiment, the semiconductor substrate 202 includes a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

The semiconductor substrate 202 includes various circuit areas, such as circuit areas 202A, 202B, 202C, 202D, and etc. It is not limiting but only illustrating by providing four circuit areas. Those circuit areas are designed to form different circuit devices having FETs with different structures and configurations. In some embodiments, the first circuit area 202A includes high scaling devices; the second circuit area 202B includes high-speed devices; the third circuit area 202C includes input/output (I/O or IO) devices; the fourth circuit area 202D includes other devices. The high scaling devices are those FETs that require high density with less dimensions, such as static random-access memory (SRAM) cells, logic devices and system-on-chip (SOC) devices. The high-speed devices include FETs that need greater dimensions, especially greater gate spacing. I/O devices include FETs that need greater active regions, multi-fins (or greater number of fin active regions), and greater fin width.

Figure 3A:
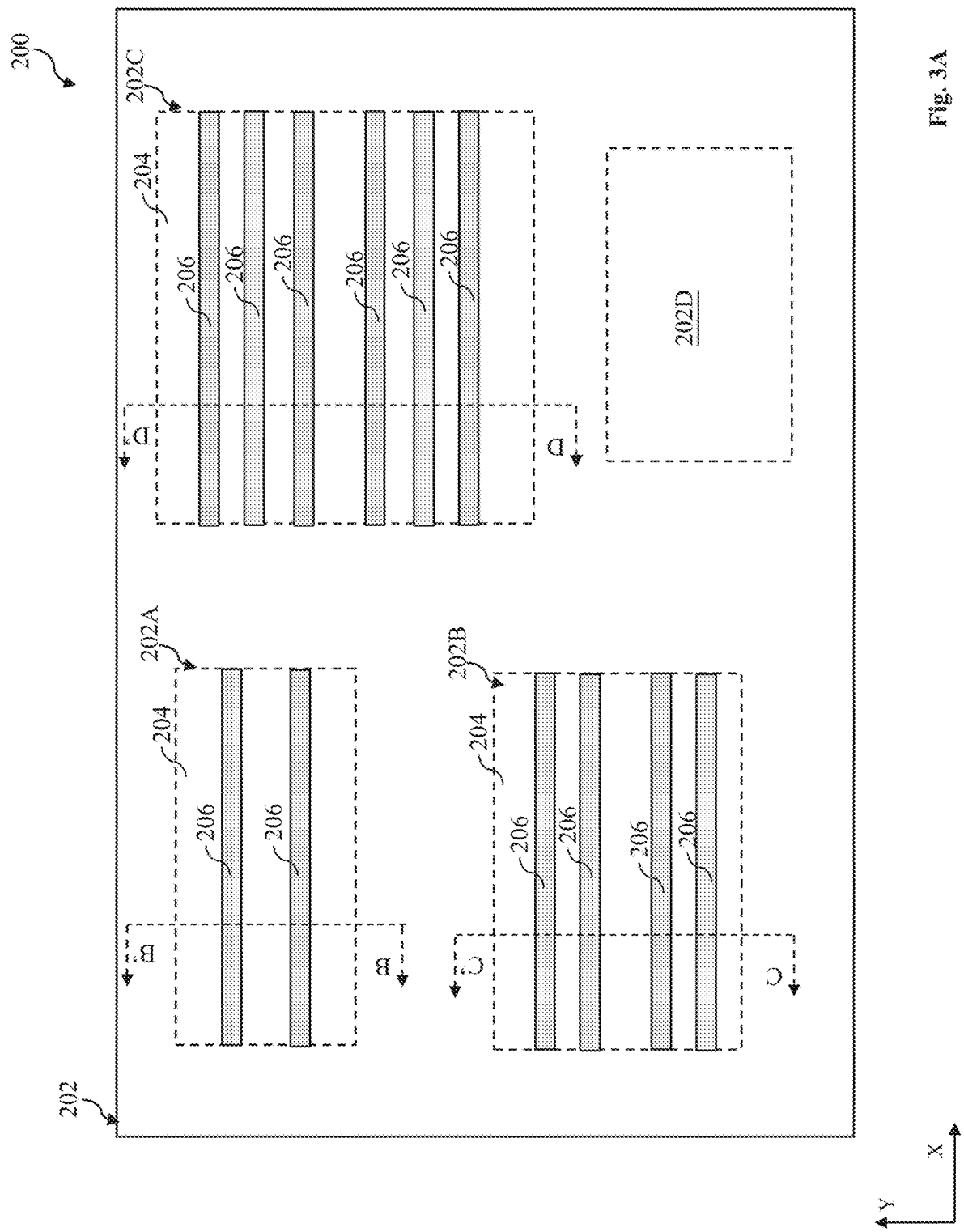
FIGS. 3A and 4A are top views of the semiconductor structure at various fabrication stages constructed according to various embodiments.

Referring to FIGS. 3A-3D, the method 100 proceeds to an operation 104 by forming fin active regions 206, such as fin active regions 206 (or fin features, or collectively a fin structure 206) in the present embodiments. FIG. 3A is a top view of the workpiece 200, FIGS. 3B, 3C and 3D are sectional views of FIG. 3A along BB', CC' and DD', respectively, according to some embodiments. The fin active regions 206 are continuously extending from the semiconductor substrate 202 and are extruding above the semiconductor substrate 202 with a three-dimensional structure.

The operation 104 includes form isolation features, such as shallow trench isolation (STI) features 204 on the semiconductor substrate 202. In some embodiments, the STI features 204 are formed by a suitable procedure that includes patterning to form trenches, filling the trenches with dielectric material and polishing to remove the excessive dielectric material and planarize the top surface. The patterning process includes a lithography process and etching and may further includes forming a patterned hard mask. One or more etching processes are performed on the semiconductor substrate 202 through openings of soft mask or hard mask, which are formed by lithography patterning and etching. The formation of the STI features 204 are further described below in accordance with some embodiments.

In the present example, a hard mask is deposited on the substrate 202 and is patterned by lithography process. The hard mask layers include a dielectric such as semiconductor oxide, semiconductor nitride, semiconductor oxynitride, and/or semiconductor carbide, and in an embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes.

A photoresist layer (or resist) used to define the fin structure may be formed on the hard mask layer. A resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the workpiece 200 by the lithography process. After patterning the resist, an etching process is performed on the semiconductor structure 200 to open the hard mask layer, thereby transferring the pattern from the resist layer to the hard mask layer. The remaining resist layer may be removed after the patterning the hard mask layer. A lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as mask-less photolithography, electron-beam writing, and ion-beam writing. The etching process to pattern the hard mask layer may include wet etching, dry etching or a combination thereof. The etching process may include multiple etching steps. For example, the silicon oxide film in the hard mask layer may be etched by a diluted hydrofluorine solution and the silicon nitride film in the hard mask layer may be etched by a phosphoric acid solution.

Then etching process may be followed to etch the portions of the substrate 202 not covered by the patterned hard mask layer. The patterned hard mask layer is used as an etch mask during the etching processes to pattern the substrate 202. The etching processes may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. Particularly, the etching process applied to the substrate is controlled such that the substrate 202 is partially etched. This may be achieved by controlling etching time or by controlling other etching parameters. After the etching processes, the fin structure 206 with fin active regions is defined on and extended from the substrate 202.

One or more dielectric material is filled in the trenches to form the STI feature 204. Suitable fill dielectric materials include semiconductor oxides, semiconductor nitrides, semiconductor oxynitrides, fluorinated silica glass (FSG), low-K dielectric materials, and/or combinations thereof. In various embodiments, the dielectric material is deposited using a HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process to remove the excessive dielectric material and planarize the top surface of the semiconductor structure. The CMP process may use the hard mask layers as a polishing stop layer to prevent polishing the semiconductor substrate 202. In this case, the CMP process completely removes the hard mask. The hard mask may be removed alternatively by an etching process. Although in further embodiments, some portion of the hard mask layers remain after the CMP process.

The operation 104 further includes forming the fin structure 206 having multiple fin active regions. In some embodiments, the operation 104 includes recessing the STI features 204 such that the fin active regions 206 are extruded above from the STI features 204, thereby forming fin active regions 206. The recessing process employs one or more etching steps (such as dry etch, wet etch or a combination thereof) to selectively etch back the STI features 204. For example, a wet etching process using hydrofluoric acid may be used to etch when the STI features 204 are silicon oxide. The fin active regions 206 are spaced from each other in Y direction. The fin active regions 206 have elongated shape and oriented along the X direction. Y direction is orthogonal to the X direction. The X and Y axes define the top surface of the semiconductor substrate 202. Alternatively, the fin active regions 206 are formed by epitaxially growing one or more semiconductor material(s) such that the fin active regions 206 are extruded above from the STI features 204.

Various doping processes may be applied to the semiconductor substrate to form various doped wells, such as n-wells 207N and p-wells 207P at the present stage or before the operation 104. Various doped wells may be formed in the semiconductor substrate 202 by respective ion implantations.

In some embodiments, the widths of the fin active regions 206 in various circuit areas may be different. The fin active regions in the first circuit area 202A for high scaling devices has a first width $W_{f1}$, the fin active regions in the second circuit area 202B for high-speed devices has a second width $W_{f2}$, and the fin active regions 206 in the third circuit area 202C for I/O devices have a third width $W_{f3}$, wherein those widths may be different from each other. In some embodiments, $W_{f3}$ is greater than $W_{f2}$ or $W_{f1}$. For example, a ratio $W_{f3}/W_{f1}$ or $W_{f3}/W_{f2}$ is greater than 1.1, such as ranging between 1.2 and 1.6.

The number of fin active regions in various circuit areas may be different. In the present embodiment, as illustrated in FIGS. 3A-3D, the first circuit area 202A includes a fin active region 206 for n-type FETs associated with a p-well 207P and a fin active region 206 for p-type FETs associated with an n-well 207N; the second circuit area 202B includes two fin active regions 206 for n-type FETs associated with a p-well 207P and two fin active region 206 for p-type FETs associated with an n-well 207N; and the third circuit area 202C includes three fin active regions 206 for n-type FETs associated with a p-well 207P and three fin active region 206 for p-type FETs associated with an n-well 207N.

Figure 4A:
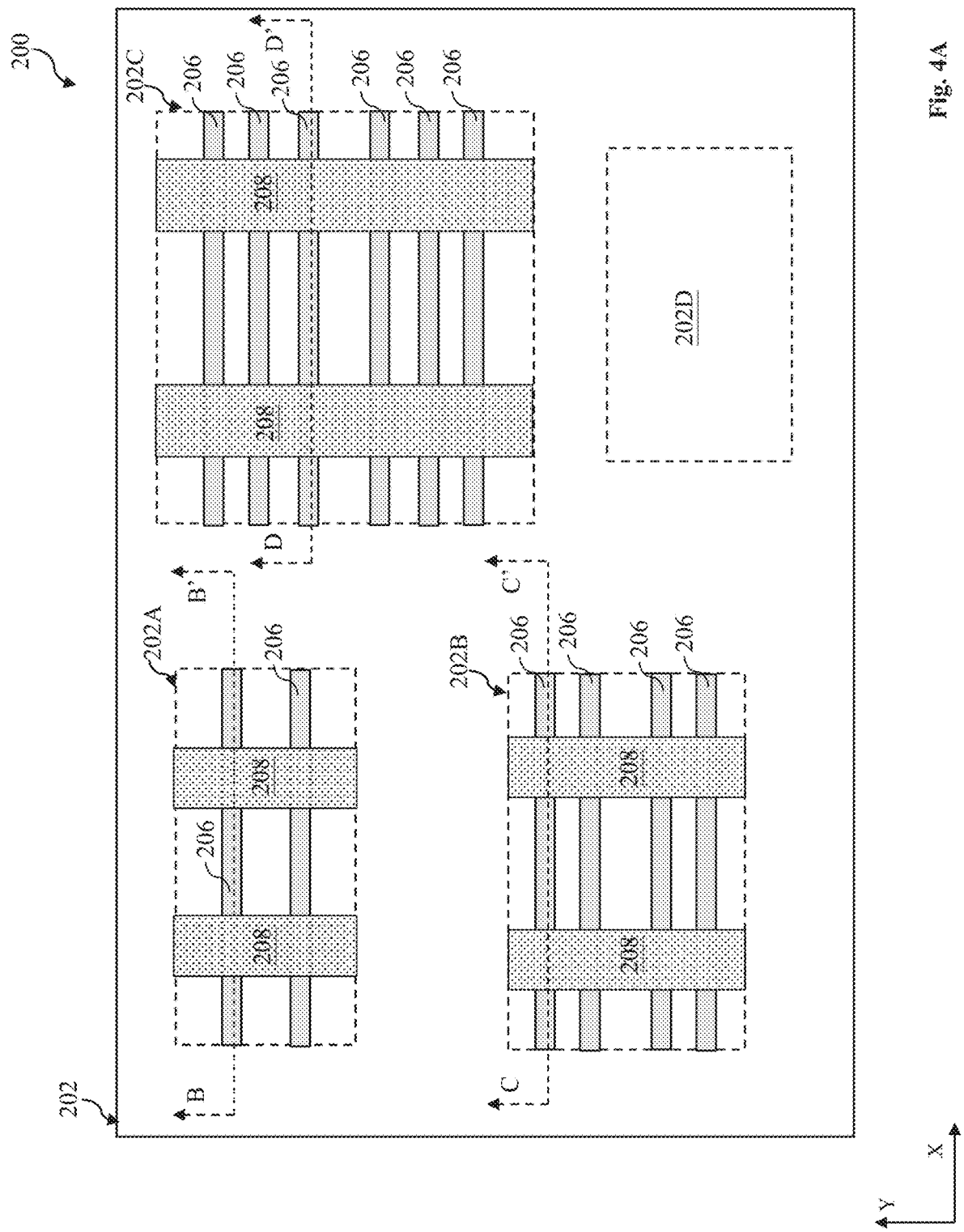

Referring to FIGS. 4A-4D, the method 100 proceeds to an operation 106 by forming various dummy gate structures 208 on the substrate 202. FIG. 4A is a top view and FIGS. 4B-4D are sectional views of FIG. 4A along BB', CC' and DD' of the workpiece 200, respectively, in accordance with some embodiments. In the present embodiment, each circuit area includes two dummy gate structures 208 disposed in parallel, as illustrated in FIG. 4A. However, it is illustrating without limiting. Each circuit area may include more fin active regions and may include some fin active regions configured differently, such as disposed on STI features. The dummy gate structures 208 have elongated shapes and are oriented in the second direction (Y direction). Each of the gate structures 208 may be disposed over multiple fin active regions 206. Especially, some dummy gate structures 208 are formed on the fin active regions 206 and further extended onto the STI feature 204. In some embodiments, one or more dummy gate stack is disposed on ends of the fin active regions 206 so that this gate stack is partially landing on the fin active region 206 and partially landing on the STI feature 204. Those edges are configured to reduce edge effect and improve overall device performance.

A dummy gate structure 208 includes a dummy gate stack 210 that may further include a gate dielectric layer and a gate electrode. The gate dielectric layer includes a dielectric material, such as silicon oxide. The gate electrode includes a conductive material, such as polysilicon. The formation of the gate stacks 210 includes depositing the gate materials (including polysilicon in the present example); and patterning the gate materials by a lithographic process and etching. A gate hard mask may be formed on the gate materials and is used as an etch mask during the formation of the gate stacks. The gate hard mask may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the dummy gate stacks 210 includes forming a patterned resist layer on the hard mask by lithography process; etching the hard mask using the patterned resist layer as an etch mask; and etching the gate materials to form the gate stacks 210 using the patterned hard mask as an etch mask.

The gate structures 208 may further include gate sidewall features (or gate spacers) 212 are formed on the sidewalls of the gate stacks 210. The gate spacers 212 provide isolation between gate electrode and source/drain features, and may be used to offset the subsequently formed source/drain features and may be used for designing or modifying the source/drain structure profile. The gate spacers 212 may include any suitable dielectric material, such as a semiconductor oxide, a semiconductor nitride, a semiconductor carbide, a semiconductor oxynitride, other suitable dielectric materials, and/or combinations thereof. The gate spacers 212 may have multiple films, such as two films (a silicon oxide film and a silicon nitride film) or three films ((a silicon oxide film; a silicon nitride film; and a silicon oxide film). The formation of the gate spacers 212 includes deposition and anisotropic etching, such as dry etching.

The dummy gate stacks 210 will be replaced by functional gate stacks that are configured in the fin active regions for various field effect transistors (FETs), therefore also referred to as FinFETs. In some examples, the field effect transistors include n-type transistors and p-type transistors. In the depicted embodiment, those field effect transistors are configured to form high scaling devices in the first circuit area 202A, high-speed devices in the second circuit area 202B, I/O devices in the third circuit area 202C, and so on.

Furthermore, the gate stacks 210 in various circuit areas are configured with different structure and configuration, such as different gate widths and gate spacings. In some embodiments, the widths of the gate stacks 210 in various circuit areas may be different. The gate stacks in the first circuit area 202A for high scaling devices has a first gate width $W_1$ and a first gate spacing $S_1$, the gate stacks in the second circuit area 202B for high-speed devices has a second gate width $W_2$ and a second gate spacing $S_2$, and the gate stacks in the third circuit area 202C for I/O devices have a third gate width $W_3$ and a third gate spacing $S_3$, wherein those gate widths and gate spacings in various circuit areas may be different. In some embodiments, $W_3$ is greater than $W_2$ or $W_1$. For example, a ratio $W_3/W_1$ or $W_3/W_2$ is greater than 1.1, such as ranging between 1.2 and 1.6. In some embodiments, $S_3$ is greater than $S_2$ and $S_2$ is greater than $S_1$. For example, a ratio $S_3/S_1$ is greater than 1.2, such as ranging between 1.2 and 1.8, and a ratio $S_3/S_1$ or $S_3/S_2$ is greater than 1.5, such as ranging between 1.6 and 2.4.

Figure 5A:
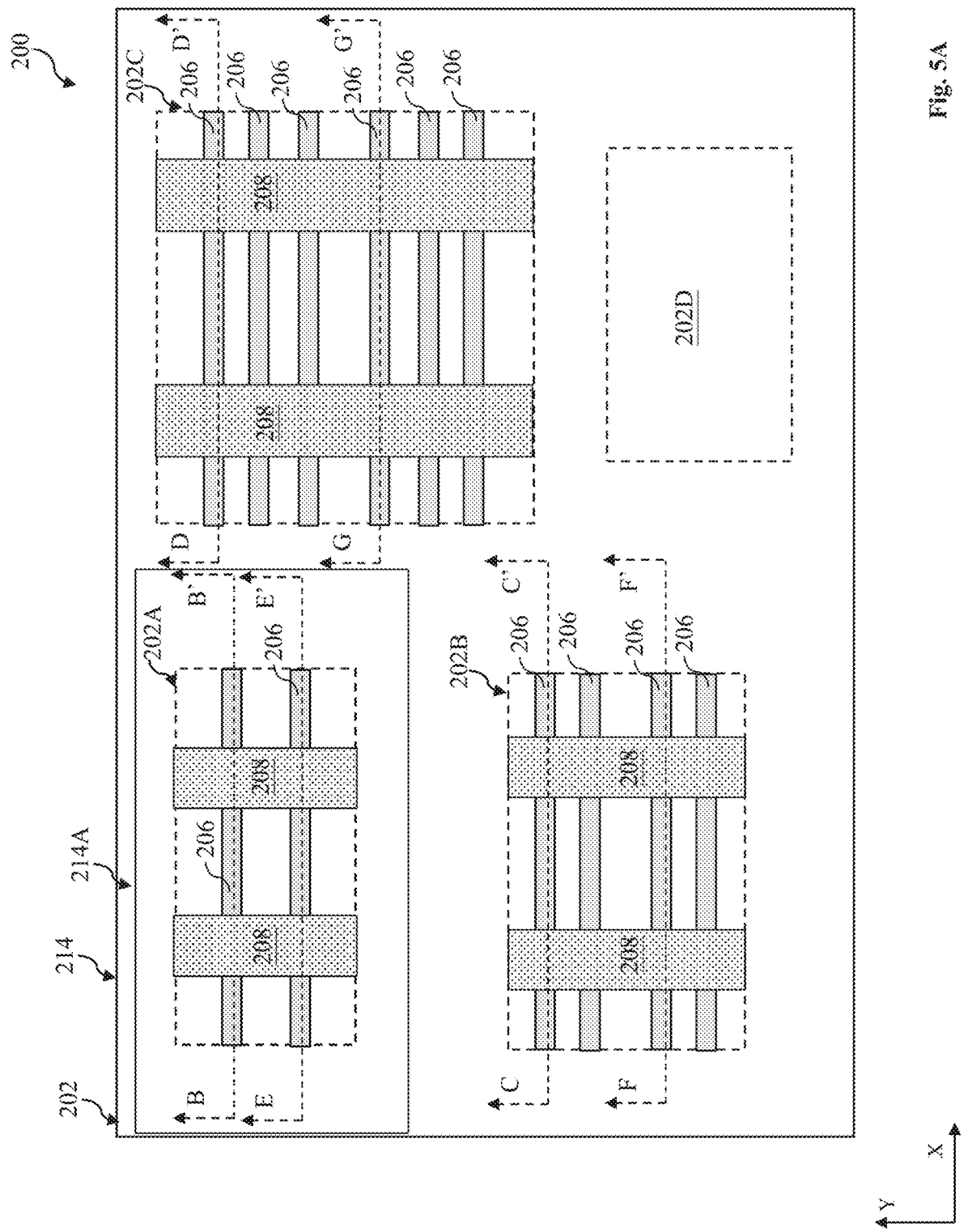
FIGS. 5A, 6A, 7A, 8A, 9A, 10A, and 11A are top views of a semiconductor structure at various fabrication stages constructed according to some embodiments.

Referring to FIGS. 5A-5G, the method 100 proceeds to an operation 108 by performing a treatment to introduce one or more doping species into some fin active regions 206, particularly, the corresponding source/drain regions, thereby varying etch rate during subsequent etching process to recess source/drain (S/D) regions 216. FIG. 5A is a top view and FIGS. 5B-5G are sectional views of the workpiece 200 of FIG. 5A along BB', CC', DD', EE', FF' and GG' of the workpiece 200, respectively, in portion, constructed according to some embodiments. In the present embodiment, the doping species is introduced into the fin active regions, particularly the source/drain regions 216 in the first circuit area 202A, thereby varying the composition there and accordingly varying (increasing or decreasing) the etch rate of the corresponding source/drain regions 216 during the subsequent etching process to recess the source/drain regions 216. The functions of the treatment to the source/drain regions 216 will be further described at subsequent operations.

The treatment to the source/drain regions 216 are not applied to all circuit areas. In the present embodiment, the treatment is applied only to the source/drain regions 216 in the first circuit area 202A. This is achieved by utilizing a patterned mask with multiple sub-operations 112 through 116 described below.

The operation 112 includes forming a patterned mask 214 with an opening 214A such that the first circuit area 202A is exposed within the opening 214A while other circuit areas are covered by the patterned mask 214. In various embodiments, the patterned mask 214 may be a soft mask (such as photoresist) or hard mask (such as one or more dielectric material layer). When the patterned mask is soft mask, the patterned photoresist layer is formed by a lithography process, such as a procedure that includes photoresist coating, soft baking, exposure using a photomask, post-exposure-baking, developing and hard baking according one example. Since opening 214A is aligned to the first circuit area 202A with great dimensions, the photomask used in the lithography process can be a low-grade photomask with low resolution, compared to high-grade photomask to be used during the subsequent operations, such as forming a patterned mask to cover n-type or p-type source/drain regions before recessing the p-type or n-type source/drain regions. Accordingly, the lithography system used in the lithography process can also be low-grade lithography system with low resolution. For example, a high-grade photomask and lithography system are associated with an extreme ultra-violet (EUV) light, an EUV lithography system having a resolution about several nanometers while a low-grade photomask and lithography system are associated with a deep ultra-violet (DUV) lithography system having a resolution about tens of nanometers. In another example, a high-grade photomask and lithography system are associated with a DUV lithography system using argon fluoride (ArF) excimer laser and having a resolution about 65 nm while a low-grade photomask and lithography system are associated with a DUV lithography system using krypton fluoride (KrF) excimer laser and having a resolution about 130 nm.

In some embodiments, a hard mask is used, it is formed by depositing one or more hard mask material (such as silicon nitride), forming a patterned photoresist layer by lithography process, and etching to the hard mask material to form the patterned hard mask.

The method 100 also includes an operation 114 includes an ion implantation process 218 applied to the source/drain regions 216 within the first circuit area 202A, thereby introducing the doping species therein. The doping species is introduced into the source/drain regions 216 but not to the channels (portions of the fin active regions 206 underlying the gate stacks 210) since the channels are covered by the dummy gate structures 208. Thus, the patterned mask 214 and the gate structures 208 are collectively functioning as a protection mask during the process to introducing the doping species into the source/drain regions 216.

In some embodiments, the doping species includes at least one of carbon (C), silicon (Si), germanium (Ge), hydrogen (H), nitrogen (N), fluorine (F), argon (Ar) and a combination thereof. Alternatively, or additionally, the doping species includes at least one of gallium (Ga), phosphorous (P), arsenic (As) and a combination thereof. The doping species introduced into the source/drain regions 216 within the first circuit area 202A is not to form doped source/drain features as those will be removed during subsequent recessing. Instead, it is aimed to modify the treated source/drain regions 216 so to have a different etch rate during the subsequent etching process to recess the source/drain regions 216. More particularly, the etch rate of the treated source/drain regions 216 is increased. The etch rate is changed (increased in the present embodiment) with following reasons based on our experiments and analysis. The implanted ions will damage the source/drain regions 216, cause structural changes (such as defects and density) and accordingly increase the etch rate. In some embodiments, charging effect contributes to the enhancement of the etch rate. Charges, such as dipole, will increase the chemical and/or physical interaction between the etchant and fin active regions 206 (such as silicon or silicon germanium) and accordingly increase the etch rate. The charging effect depends on the doping species. In furtherance of the embodiments, when the doping species is in V-group of the periodic table of elements, etch rate is substantially increased. When the doping species is in IV-group of the periodic table of elements, etch rate is increased but less than that of the V-group. When the doping species is in III-group of the periodic table of elements, etch rate is increased but less than that of the IV-group. In some embodiments, the doping concentration ranges between $1\times10^{19}$ and $1\times10^{22}$ (cm$^3$). The corresponding implantation dose ranges between $1\times10^{14}$ and $1\times10^{16}$ (cm$^2$). The ion implantation process includes a bias power ranging between 100 eV and 10K eV for intended damage and etch reduction.

Treatment may also introduce the doping species in the gate spacers 212, so changing the composition of the gate spacers 212, which will make the treated gate spacers 212 different from the untreated gate spacers 212, such as in composition. For example, when the untreated gate spacers 212 includes silicon oxide, silicon nitride or dual layers with both, the treated gate spacers 212 includes silicon oxide, silicon nitride or the dual layers with doped species (such as Ar or F).

The method 100 also includes an operation 116 to remove the patterned mask 214 after the treatment. It is removed by stripping or ashing when the patterned mask 214 is photoresist, or alternatively by etching when the patterned mask 214 is hard mask.

The method 100 proceeds to operation 118 to form source/drain features. The formation of the source/drain features includes etching to recess the source/drain regions 216 and epitaxially growing source/drain features. Since different circuit areas have different gate structures with different etch loading effect, etch depths in different circuit areas can be different, rendering the recessed source/drain depth uneven and device performance variation and non-uniformity. The etch loading effect is associated with the mechanism of the etching process. For example, the etch rate is greater when the gate spacing is greater and is less when the gate spacing is less. The treatment applied to circuit areas (such as the first circuit area 202A) will vary the etch rate and compensate the variation of the etch rate in different circuit areas. Accordingly, the modified mount to the etch rate can be determined based on the dimensions of various circuit areas and the corresponding etch loading effect so that the compensated final etch rate (collectively including the combining factors of both the etch loading effect and the modified etch rate by the treatment) is uniformly in different circuit areas. The operation 108 includes multiple sub-operations, such as 120 through 134, according to some embodiments. The operations 120 through 134 will be described below in detail.

Figure 6A:
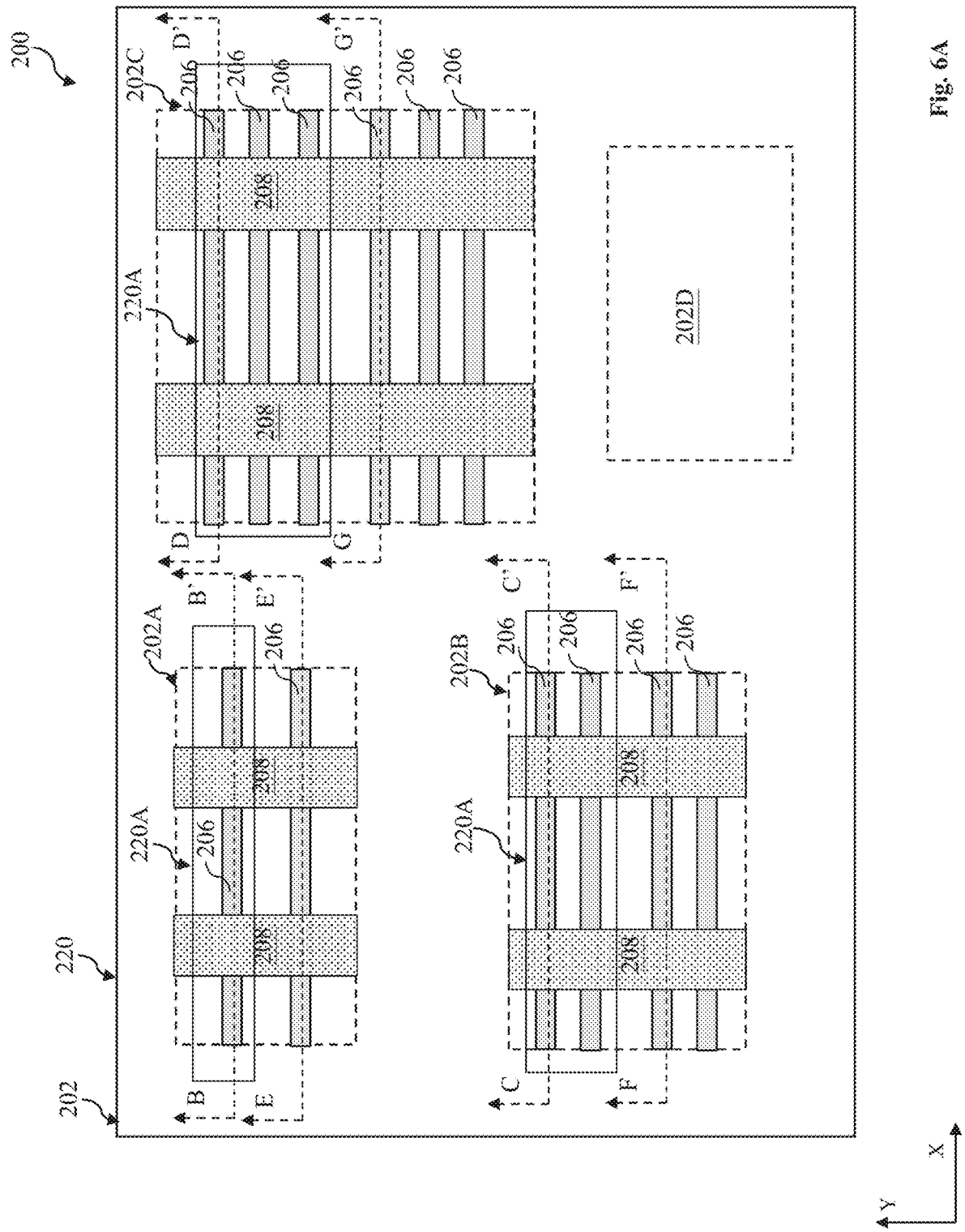

In the depicted embodiment, the n-type and p-type source/drain features are formed separately. The method 100 includes an operation 120 to form a second patterned mask 220 with openings 220A to expose fin active regions 206 for n-type FETs in various circuit areas, or more particularly, to expose n-type source/drain regions, as illustrated in FIGS. 6A-6G. FIG. 6A is a top view and FIGS. 6B-6G are sectional views of the workpiece 200 of FIG. 6A along BB', CC', DD', EE', FF' and GG' of the workpiece 200, respectively, in portion, constructed according to some embodiments. The formation of the second patterned mask 220 is similar to the formation of the first patterned mask 214. However, the second patterned mask 220 includes the openings 220A with less dimensions and need to be formed by a high-grade photomask and a lithography system with high resolution.

Still referring to FIGS. 6A-6G, the method 100 proceeds to an operation 122 by performing a first etching process to recess the n-type source/drain regions 216 while the p-type source/drain regions 216 are covered by the second patterned mask 220. In some embodiments, the first etching process is a dry etch using an etchant that includes chlorine-containing gas, fluorine-containing gas or both, such as $Cl_2$, $CCl_2F_2$, $SF_6$, or a combination thereof. The first etching process forms source/drain recesses (or n-type source/drain recesses, or trenches) 222 in various circuit areas.

As described above, without treatment, the etch rate of the source/drain regions 216 in the first circuit area 202A is less than those of the source/drain regions 216 in the second circuit area 202B and the third circuit area 202C due to the etch loading effect. However, with the source/drain regions 216 in the first circuit area 202A treated at the operation 108, the corresponding etch rate is increased. The depths of the n-type source/drain recesses 222 in various circuit areas are substantially equal or close with minimal disparity.

Figure 7A:
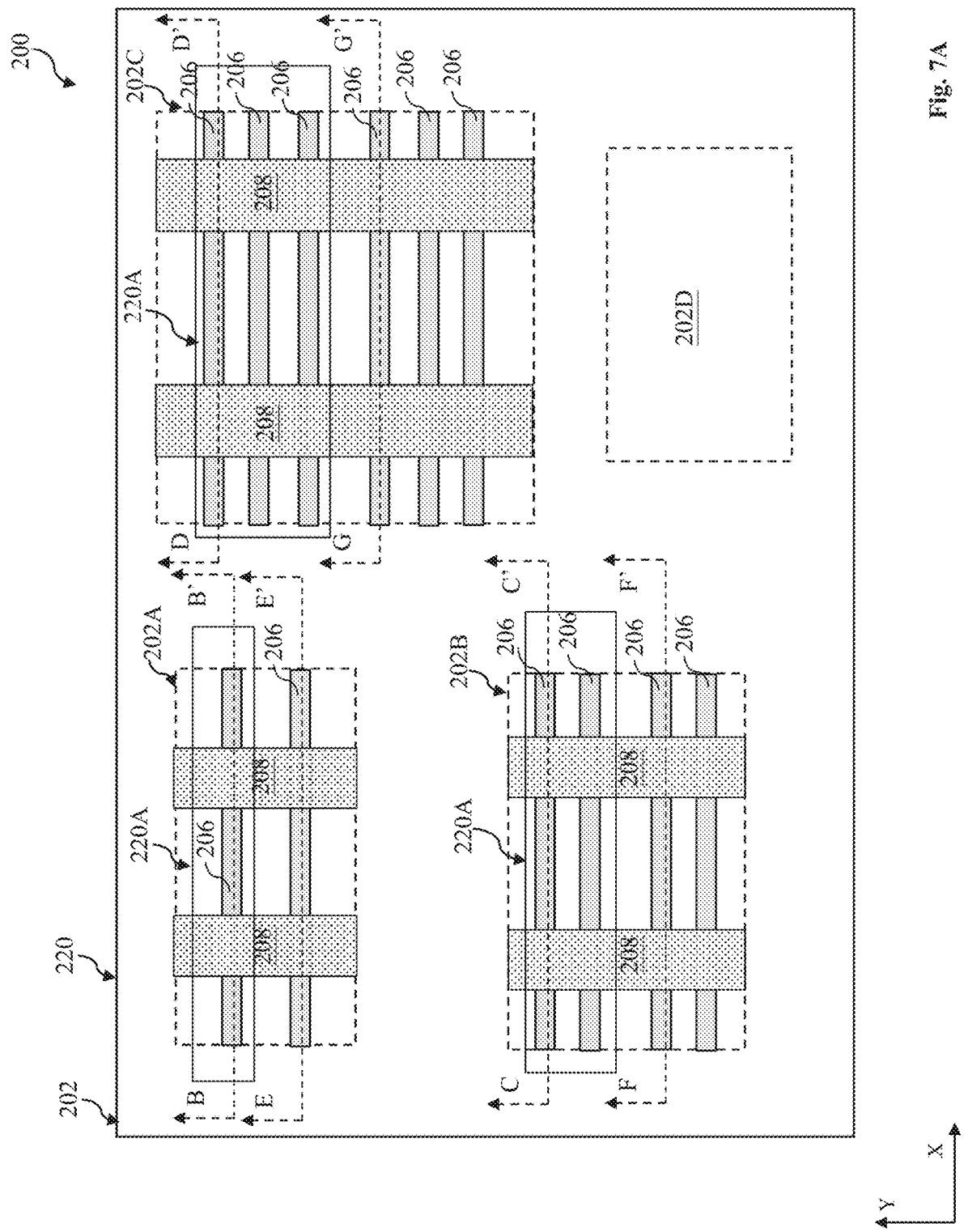

Referring to FIGS. 7A-7G, the method 100 proceeds an operation 124 to form n-type source/drain features 224 in the n-type source/drain recesses 222 for n-type FETs in various circuit areas. FIG. 7A is a top view and FIGS. 7B-7G are sectional views of the workpiece 200 of FIG. 7A along BB', CC', DD', EE', FF' and GG' of the workpiece 200, respectively, in portion, constructed according to some embodiments. The formation of the n-type source/drain features 224 includes epitaxially growing one or more semiconductor material with n-type dopant (such as phosphorous or arsenic).

The source/drain features 224 are formed within the source/drain recesses 222 on the respective fin active region and interposed by the gate structure 208. A channel is formed in the fin active region in a portion that is underlying the gate stack 210 and spans between the adjacent source/drain features 224. The source/drain features may be grown above the top surface of the fin active regions 206, being referred to as raised source/drain features.

The source/drain features 224 may be formed by selective epitaxy growth for strain effect with enhanced carrier mobility and device performance. The gate stacks 210 and gate spacer 212 constrain the source/drain features 224 to the source/drain regions. In some embodiments, the source/drain features 224 are formed by one or more epitaxy or epitaxial (epi) processes, whereby Si features, SiGe features, SiC features, and/or other suitable features are grown in a crystalline state on the fin active regions 206. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin structure 206.

The source/drain features 224 may be in-situ doped during the epitaxy process by introducing n-type doping species, such as phosphorus or arsenic; and/or other suitable dopants. If the source/drain features 224 are not in-situ doped, an implantation process (i.e., a junction implant process) is performed to introduce the corresponding dopant into the source/drain features 224. In an embodiment, the source/drain features 224 for nFETs include SiC or Si doped with phosphorous. In some other embodiments, the source/drain features 224 include more than one semiconductor material layers. For example, a silicon germanium layer is epitaxially grown within the source/drain regions and a silicon layer is epitaxially grown on the silicon germanium layer. One or more annealing processes may be performed thereafter to activate the source/drain features 224. Suitable annealing processes include rapid thermal annealing (RTA), laser annealing processes, other suitable annealing technique or a combination thereof.

Still referring to FIGS. 7A-7G, the method 100 proceeds an operation 126 to remove the second patterned mask 220 using a suitable process, such as etching, stripping or ashing. Then the method proceeds to form p-type source/drain features, as described below.

Figure 8A:
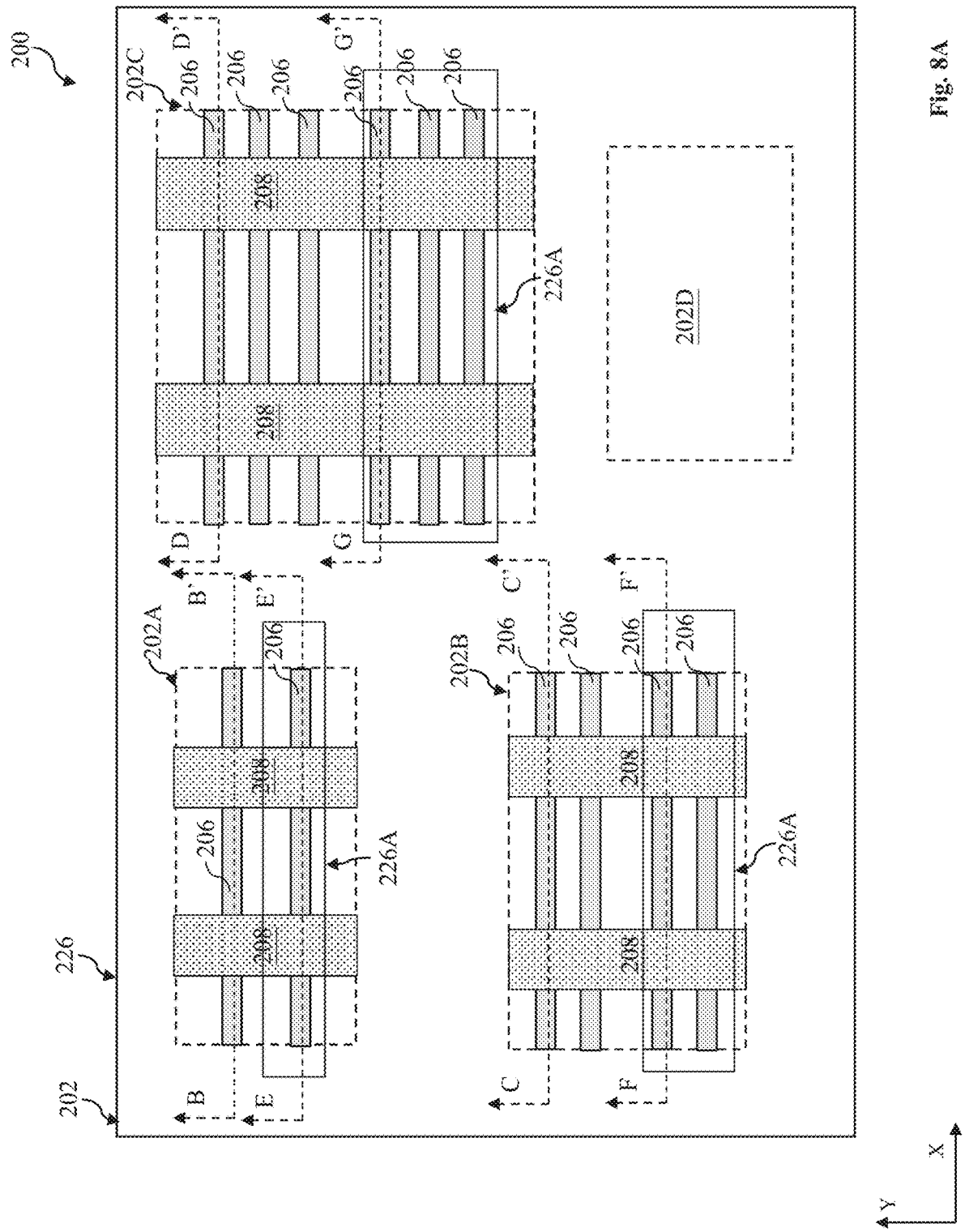

The method 100 includes an operation 128 to form a third patterned mask 226 with openings 226A to expose fin active regions 206 for p-type FETs in various circuit areas, or more particularly, to expose p-type source/drain regions, as illustrated in FIGS. 8A-8G. FIG. 8A is a top view and FIGS. 8B-8G are sectional views of the workpiece 200 of FIG. 8A along BB', CC', DD', EE', FF' and GG' of the workpiece 200, respectively, in portion, constructed according to some embodiments. The formation of the third patterned mask 226 is similar to the formation of the second patterned mask 220. For example, the third patterned mask 226 includes the openings 226A with less dimensions and need to be formed by a high-grade photomask and a lithography system with high resolution.

Still referring to FIGS. 8A-8G, the method 100 proceeds to an operation 130 by performing a second etching process to recess the p-type source/drain regions 216 while the n-type source/drain features 224 are covered by the third patterned mask 226. In some embodiments, the second etching process is a dry etch using an etchant that includes chlorine-containing gas, fluorine-containing gas or both, such as $Cl_2$, $CCl_2F_2$, $SF_6$, or a combination thereof. The second etching process forms source/drain recesses (or p-type source/drain recesses, or trenches) 228 in various circuit areas. As described above, without treatment, the etch rate of the source/drain regions 216 in the first circuit area 202A is less than those of the source/drain regions 216 in the second circuit area 202B and the third circuit area 202C due to the etch loading effect. However, with the source/drain regions 216 in the first circuit area 202A treated at the operation 108, the corresponding etch rate is increased. The depths of the p-type source/drain recesses 228 in various circuit areas are substantially equal or close with minimal disparity.

Figure 9A:
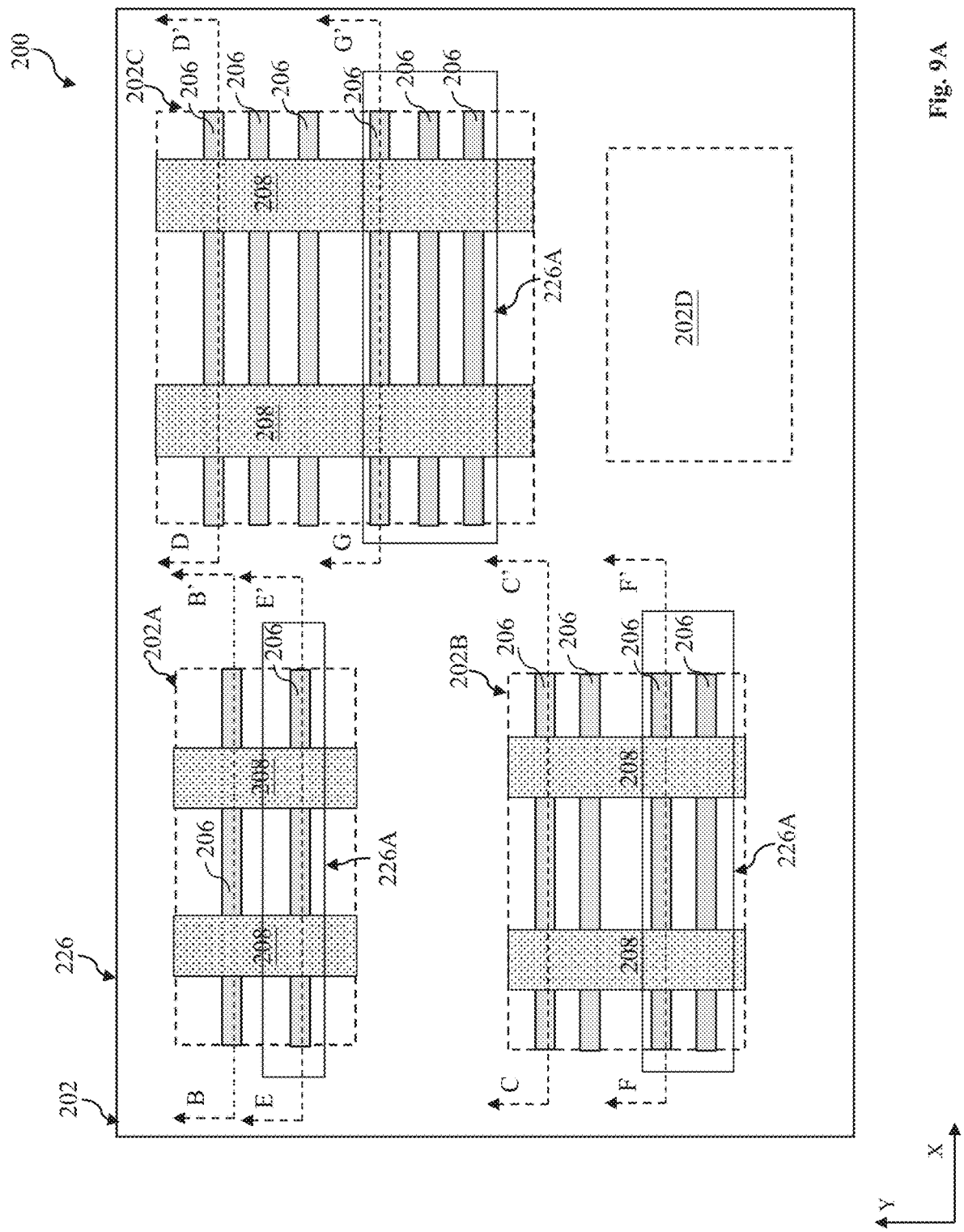

Referring to FIGS. 9A-9G, the method 100 proceeds an operation 132 to form p-type source/drain features 230 in the p-type source/drain recesses 228 for p-type FETs in various circuit areas. FIG. 9A is a top view and FIGS. 9B-9G are sectional views of the workpiece 200 of FIG. 9A along BB', CC', DD', EE', FF' and GG' of the workpiece 200, respectively, in portion, constructed according to some embodiments. The formation of the p-type source/drain features 230 includes epitaxially growing one or more semiconductor material with p-type dopant (such as boron or $BF_2$).

The source/drain features 230 are formed within the source/drain recesses 228 on the respective fin active region and interposed by the gate structure 208. A channel is formed in the fin active region in a portion that is underlying the gate stack 210 and spans between the adjacent source/drain features 230. The source/drain features may be grown above the top surface of the fin active regions 206, being referred to as raised source/drain features.

The source/drain features 230 may be formed by selective epitaxy growth for strain effect with enhanced carrier mobility and device performance. The gate stacks 210 and gate spacer 212 constrain the source/drain features 230 to the source/drain regions. In some embodiments, the source/drain features 230 are formed by one or more epitaxy or epitaxial (epi) processes, whereby Si features, SiGe features, and/or other suitable features are grown in a crystalline state on the fin active regions 206. Suitable epitaxy processes include CVD deposition techniques (e.g., VPE and/or UHV-CVD), molecular beam epitaxy, and/or other suitable processes. The epitaxy process may use gaseous and/or liquid precursors, which interact with the composition of the fin structure 206.

The source/drain features 230 may be in-situ doped during the epitaxy process by introducing p-type doping species, such as boron or $BF_2$; and/or other suitable dopants. If the source/drain features 230 are not in-situ doped, an implantation process (i.e., a junction implant process) is performed to introduce the corresponding dopant into the source/drain features 230. In an embodiment, the source/drain features 230 for pFETs include SiGe or Si doped with boron. In some other embodiments, the source/drain features 230 include more than one semiconductor material layers. For example, a silicon germanium layer is epitaxially grown within the source/drain regions and a silicon layer is epitaxially grown on the silicon germanium layer. One or more annealing processes may be performed thereafter to activate the source/drain features 230.

Still referring to FIGS. 9A-9G, the method 100 proceeds an operation 134 to remove the third patterned mask 226 using a suitable process, such as etching, stripping or ashing. In the above operations, the n-type source/drain features 224 are first formed and the p-type source/drain features 230 are formed afterward. In some embodiments, the sequence may be otherwise. For example, the p-type source/drain features 230 are first formed and the n-type source/drain features 224 are formed afterward. In this case, the operations 128-134 are implemented before the operations 120 through 126.

Figure 10A:
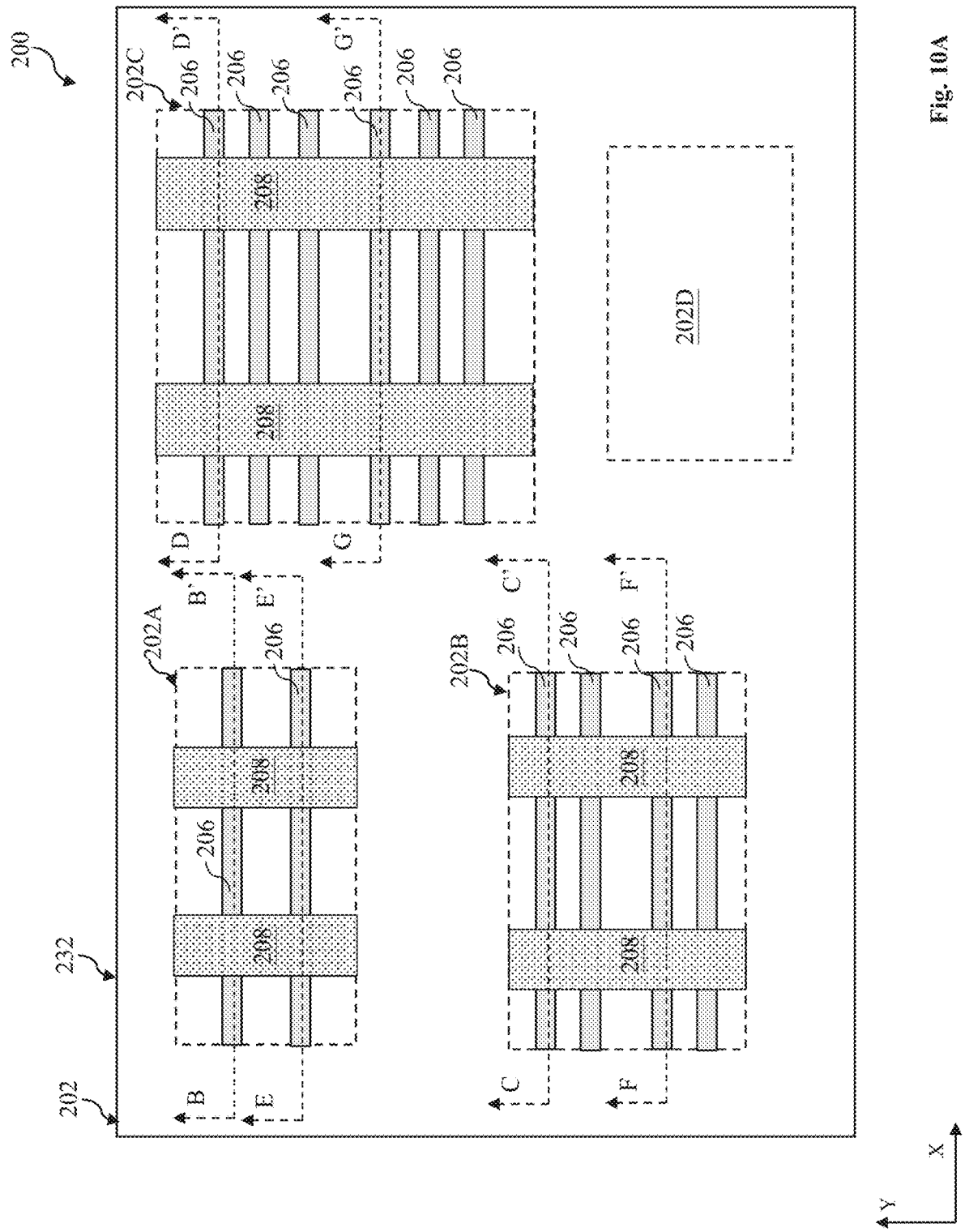

Referring to FIGS. 10A and 10G, the method proceeds to an operation 136, in which a first inter-level dielectric material (ILD) layer 232 is formed on the substrate, covering the source/drain features 224 and 230. FIG. 10A is a top view and FIGS. 10B-10G are sectional views of the workpiece 200 of FIG. 10A along BB', CC', DD', EE', FF' and GG' of the workpiece 200, respectively, in portion, constructed according to some embodiments. The source/drain features 224 and 230 and the fin active regions 206 are shown in FIG. 10A and following figures in top view for better illustration even though those features are covered by the overlying features, such as the ILD layer 232. The ILD layer 232 surrounds the dummy gate stacks 210 and the gate spacers 212 allowing the gate stacks 210 to be removed and a replacement gate to be formed in the resulting cavity (also referred to as gate trench). Accordingly, in such embodiments, the gate stacks 210 are removed after the formation of the ILD layer 232. The ILD layer 232 may also be part of an electrical interconnect structure that electrically interconnects various devices of the semiconductor structure 200. In such embodiments, the ILD layer 232 acts as an insulator that supports and isolates the conductive traces. The ILD layer 232 may include any suitable dielectric material, such as a semiconductor oxide, a semiconductor nitride, a semiconductor oxynitride, other suitable dielectric materials, or combinations thereof. In some embodiments, the formation of the ILD layer 232 includes deposition and CMP to provide a planarized top surface. In some embodiments, a hard mask may be used to form the gate stacks 210 and present on the top of the gate stacks 210. In this case, the hard mask may also be removed, such as by the CMP or etch.

Figure 11A:
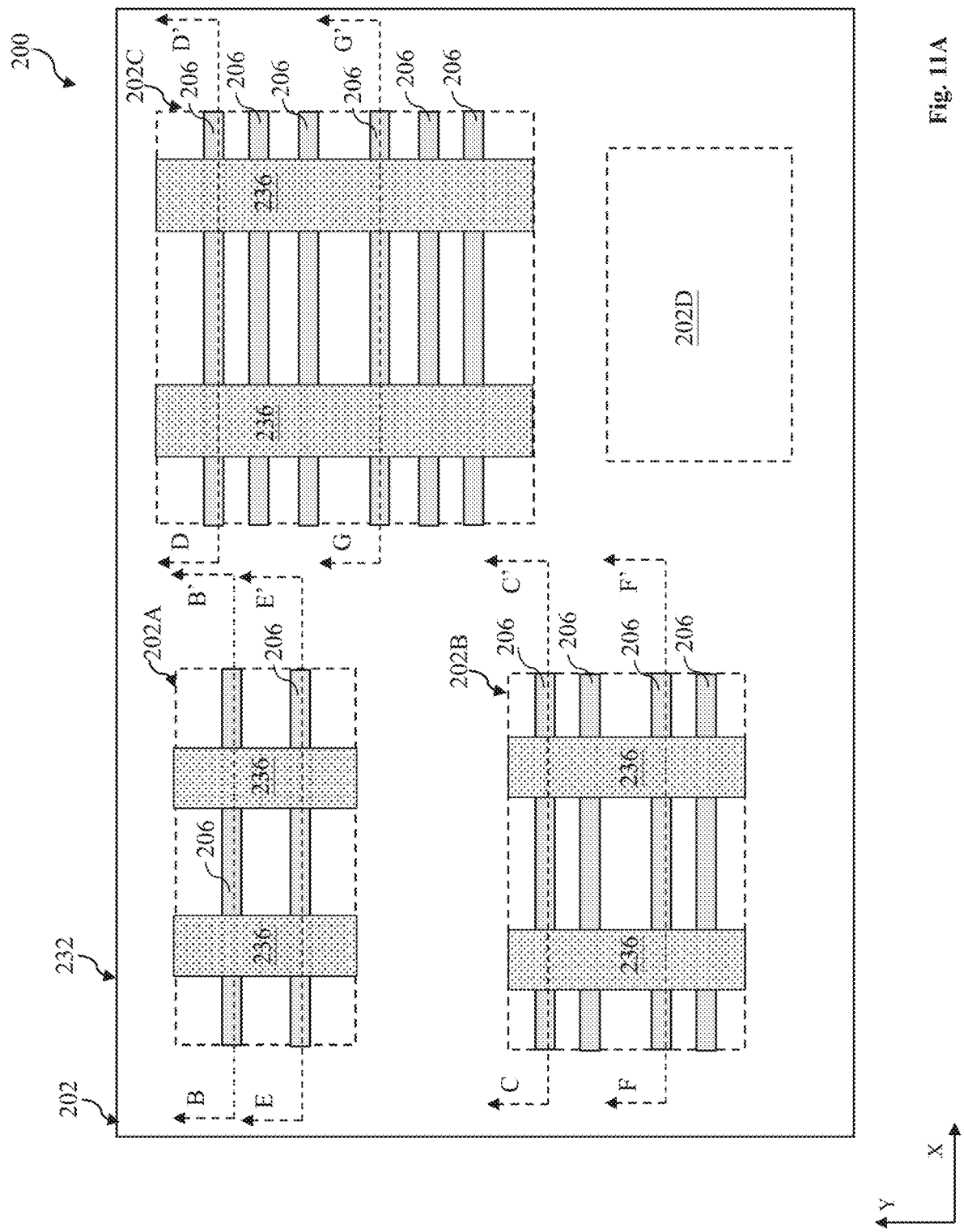

Referring to FIGS. 11A and 11G, the method proceeds to an operation 138 for gate replacement. FIG. 11A is a top view and FIGS. 11B-11G are sectional views of the workpiece 200 of FIG. 11A along BB', CC', DD', EE', FF' and GG' of the workpiece 200, respectively, in portion, constructed according to some embodiments. At the operation, the dummy gate stacks 210 are replaced by gate stacks 234 with high k dielectric and metal, therefore also referred to as high-k metal gate stacks 234. Such formed final gate structures include high-k metal gate stacks 234 and are labeled by 236. The gate stacks 234 each includes a gate dielectric layer and a gate electrode disposed on the gate dielectric layer. The gate dielectric layer includes one or more high-k dielectric material and may further includes an interfacial layer (such as silicon oxide) interposed between the channel and the high-k dielectric material. The gate electrode includes one or more metal or alloy, such as copper, tungsten, metal silicide, other suitable metal-containing conductive material, or a combination thereof. In some embodiments, the gate electrodes include other materials, such as work function metal, which is used to reduce the threshold voltages of the corresponding FETs. The work function metal used in the gate stacks 234 are different from nFETs and pFETs, and thus may be separately formed.

The gate replacement process may include etching, deposition and polishing. In the present example for illustration, the dummy gate stacks 210 are selectively removed by etching (such as wet etch), resulting in gate trenches. The etching process may include multiple etching steps to remove the dummy gate stacks if more materials present.

Then the gate materials, such as high k dielectric material and metal, are deposited in the gate trenches to form the high-k metal gate stacks 234, as illustrated in FIGS. 11B through 11G. A CMP process is further implemented to polish and remove the excessive gate materials from the workpiece 200.

When the gate stacks 234 are formed separately for nFETs and pFETs, patterning processes are used to separately form two-type gate stacks 234. For example, a patterned mask is formed to cover the gate stacks 210 for pFETs and to expose the gate stacks 210 for nFETs within openings. the high-k metal gate stacks 234 are formed to replace the gate stacks 210 for nFETs by a procedure, such as etching, deposition and CMP. Then the patterned mask is removed. Another patterned mask is formed to cover the gate stacks 234 for nFETs and to expose the gate stacks 210 for pFETs within openings. the high-k metal gate stacks 234 are formed to replace the gate stacks 210 for pFETs by a similar procedure, such as etching, deposition and CMP. Then the patterned mask is removed. The sequence may be different, such as forming high-k metal gate stacks 234 for pFETs first and forming high-k metal gate stacks 234 for nFETs thereafter. The patterned mask may be soft mask (such as photoresist) or hard mask (such as suitable dielectric material layer). The formation of the patterned masks is similar to that of the patterned masks 220 and 226 in term of processing and composition.

Figure 12B:
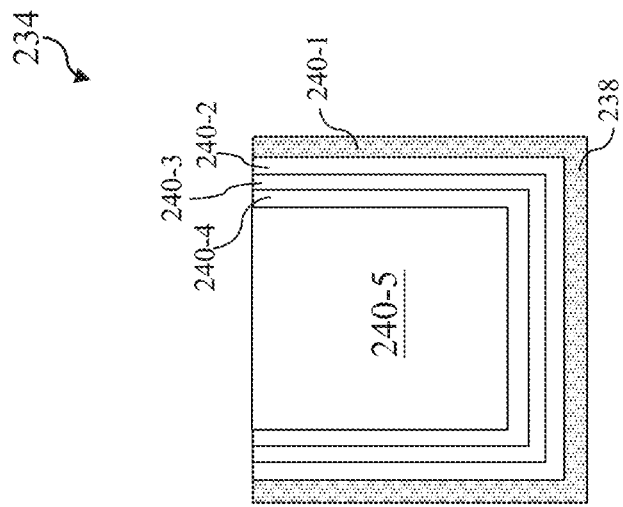
FIGS. 12A and 12B are sectional views of a gate stack constructed according to various embodiments.
Figure 12A:
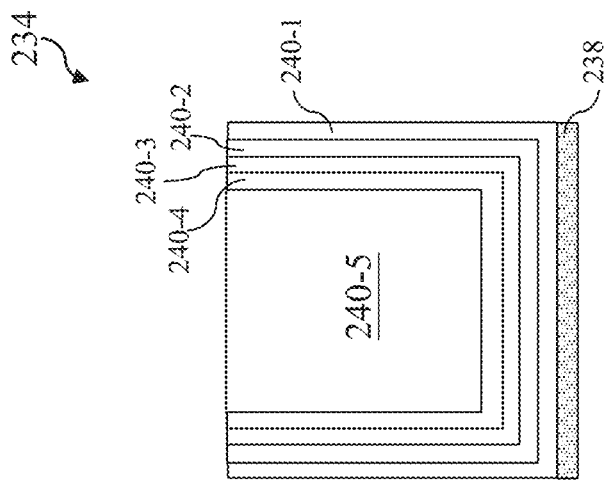

The structure and the formation of the gate stacks 234 are further described below with a reference to FIGS. 12A and 12B. FIGS. 12A and 12B illustrate sectional views of a gate stack 234 in accordance with various embodiments.

The gate stack 234 is formed in the gate trench by a proper procedure, such as a procedure that includes deposition and CMP. Although it is understood that the gate stack 234 may have any suitable gate structure and may be formed by any suitable procedure. The gate stack 234 is formed on the substrate 202 overlying the channel region of the fin active region 206. The gate stack 234 includes a gate dielectric layer 238 and a gate electrode 240 disposed on the gate dielectric layer 238. In the present embodiment, the gate dielectric layer 238 includes high-k dielectric material and the gate electrode 240 includes metal, metal alloy, metal silicide, other suitable metal-containing conductive material or a combination thereof. In some examples, the gate dielectric layer 238 and the gate electrode 240 each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate electrode 240 may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFET and pFET devices with respective work functions.

The gate dielectric layer 238 may further includes an interfacial layer sandwiched between the high-k dielectric material layer and the fin active region 206. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques. In some embodiments, the gate dielectric layer 238 is formed on the fin active region 206 at the operation 106 that forms the gate stack 210. In this case, the gate dielectric layer 238 is shaped as illustrated in FIG. 12A. In some other embodiments, the gate dielectric layer 238 is formed in the high-k last process, in which the gate dielectric layer 238 is deposited in the gate trench at 138. In this case, the gate dielectric layer 238 is U-shaped, as illustrated in FIG. 12B.

The gate electrode 240 may include multiple conductive materials. In some embodiments, the gate electrode 240 includes a capping layer 240-1, a blocking layer 240-2, a work function metal layer 240-3, another blocking layer 240-4 and a filling metal layer 240-5. In furtherance of the embodiments, the capping layer 240-1 includes titanium nitride, tantalum nitride, or other suitable material, formed by a proper deposition technique such as ALD. The blocking layer 240-2 includes titanium nitride, tantalum nitride, or other suitable material, formed by a proper deposition technique such as ALD. In some examples, the block layers may not present or only one of them presents in the gate electrode.

The work functional (WF) metal layer 240-3 includes a conductive layer of metal or metal alloy with proper work function such that the corresponding FET is enhanced for its device performance. The work function metal layer 240-3 is different for a pFET and a nFET, respectively referred to as an n-type WF metal and a p-type WF metal. The choice of the WF metal depends on the FET to be formed on the active region. For example, the semiconductor structure 200 includes a first active region for an nFET and another active region for a pFET, and accordingly, the n-type WF metal and the p-type WF metal are respectively formed in the corresponding gate stacks. Particularly, an n-type WF metal includes a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal includes a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-type WF metal include Ta, TiAl, TiAlN, tungsten nitride (WN), or combinations thereof. The n-type WF metal may include various metal-based films as a stack for optimized device performance and processing integration. In some embodiments, the p-type WF metal includes titanium nitride (TiN) or tantalum nitride (TaN). In other embodiments, the p-type WF metal include TiN, TaN, tungsten nitride (WN), titanium aluminum (TiAl), or combinations thereof. The p-type WF metal may include various metal-based films as a stack for optimized device performance and processing integration. The work function metal is deposited by a suitable technique, such as PVD or ALD.

The blocking layer 240-4 includes titanium nitride, tantalum nitride, or other suitable material, formed by a proper deposition technique such as ALD. In various embodiments, the filling metal layer 240-5 includes aluminum, tungsten or other suitable metal. The filling metal layer 240-5 is deposited by a suitable technique, such as PVD or plating. After the operation 138, the high-k metal gate stacks 234 are formed on the fin active regions 206.

In some embodiments, the method 100 may also include an operation 140 by performing other fabrication processes. For example, the method 100 includes forming self-align protection layer on top of the gate stacks 234 to protect the gate stacks 234 from loss during subsequent processing and self-align the gate contacts to the gate stacks during the etching process to form gate contacts. In some embodiments, the formation of the self-aligned protection layer includes recessing the gate stacks 234 by selective etching; depositing (such as CVD) a suitable material, such as silicon nitride or other suitable dielectric material; and CMP to remove excessive material deposited on the ILD layer 232. The self-aligned protection layer may include a suitable material different from the dielectric material of the ILD layers to achieve etching selectivity during the etching process to form contact openings.

The method 100 also includes other processes, such as forming a multiple layer interconnect (MLI) structure. The MLI structure includes various conductive features to couple the various devices to form a functional circuit. Particularly, the MLI structure includes multiple metal layers each having metal lines to provide horizontal electrical routing and includes contact and via features to provide vertical electrical routing. The MLI structure also includes multiple ILD layers to isolate various conductive features from each other. The ILD layer 232, as the first ILD layer underlying the multiple ILD layers, may be same or different from the multiple ILD layers in composition. For example, the Multiple ILD layers may include low-k dielectric material or other suitable dielectric materials, such as silicon oxide.

In various embodiments, the conductive features (such as contact features, via features and metal lines) of the MLI structure includes aluminum, copper, aluminum/silicon/copper alloy, nickel, cobalt, titanium, titanium nitride, tungsten, polysilicon, metal silicide, or combinations thereof. The MLI structure may use aluminum interconnect structure formed by deposition and etching, copper interconnect structure formed by damascene process, or self-aligned interconnect structure formed by suitable process. Those are further described below.

In the aluminum interconnection, the conductive features include aluminum, such as aluminum/silicon/copper alloy. The formation of the aluminum conductive features includes deposition, and patterning process to the deposited aluminum layer. The deposition may include physical vapor deposition (PVD), other suitable deposition, or combinations thereof. The patterning process may include a lithography process to form a patterned photoresist layer and an etching process to etch the deposited aluminum layer using the patterned photoresist layer as an etch mask. In some embodiments, a hard mask may be further used in the patterning process. The conductive features may further include barrier layers to prevent inter-diffusion. A barrier layer includes titanium/titanium nitride, tantalum/tantalum nitride or other suitable material.

In the copper interconnection, the conductive features include copper and may further include a barrier layer. The copper interconnect structure is formed by a damascene process. A damascene process includes depositing an ILD layer; patterning the ILD layer to form trenches; depositing various conductive materials (such as a barrier layer and copper); and performing a CMP process. A damascene process may be a single damascene process or a dual damascene process. The deposition of the copper may include PVD to form a seed layer and plating to form bulk copper on the copper seed layer. A self-aligned interconnect structure may be a portion of the MLI structure and may be formed by suitable process, such as a procedure includes selective deposition.

Other fabrication operations may be implemented before, during and after the operations of the method. Some operations may be implemented by an alternative operation. For example, a patterning process may be implemented through double patterning or multiple patterning. In some embodiments, prior to the filling in the conductive material in the contact holes, silicide may be formed on the source/drain features to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal.

Other structure may be achieved within the scope of the present disclosure. For example, the workpiece 200 may include other circuit areas having FETs with different structure and configuration. In some examples, the workpiece 200 includes a three-dimensional structure having FETs with multiple channels vertically stacked, such as gate-all-around (GAA) structure.

In the disclosed method 100, an ion implantation process is applied to the first circuit area 202A, introducing the doping species thereto. In some alternative embodiments, an ion implantation process is applied to both the first circuit area 202A and the second circuit area 202B, introducing the doping species thereto.

In some embodiments, the doping species introduced into the source/drain regions is chosen to decrease the etch rate of the source/drain regions during the etching process to recess the source/drain regions. In furtherance of the embodiments, the doping species includes boron (B), such as boron or boron fluoride ($BF_2$) due to chemical reaction according to our experiments. The doping species to decrease the etch rate (such as B or $BF_2$) is referred to as etch-reducing species while the doping species to increase the etch rate (such as C, Si, Ge, H, N, F, or Ar) is referred to as etch-enhancing species. In this case, the source/drain regions treated by introducing the etch-reducing species through the ion implantation have reduced etch rate during the etching process to recess the source/drain regions. In the present embodiment, the etch-reducing species is introduced to the source/drain regions 216 associated with the circuit area with a greater gate spacing, thus decreasing the corresponding etch rate and compensate the etch loading effect to achieve the uniform etch rate. For examples, the operation 112 includes forming the first patterned mask with opening to expose the third circuit area 202C; and the operation 114 includes performing an ion implantation to introduce the etch-reducing species (such as B or $BF_2$) into the source/drain regions within the third circuit area 202C. In some alternative examples, the operation 112 includes forming the first patterned mask with openings to expose the second circuit area 202B and third circuit area 202C; and the operation 114 includes performing an ion implantation to introduce the etch-reducing species (such as B or $BF_2$) into the source/drain regions within the second circuit area 202B and the third circuit area 202C.

Figure 13:
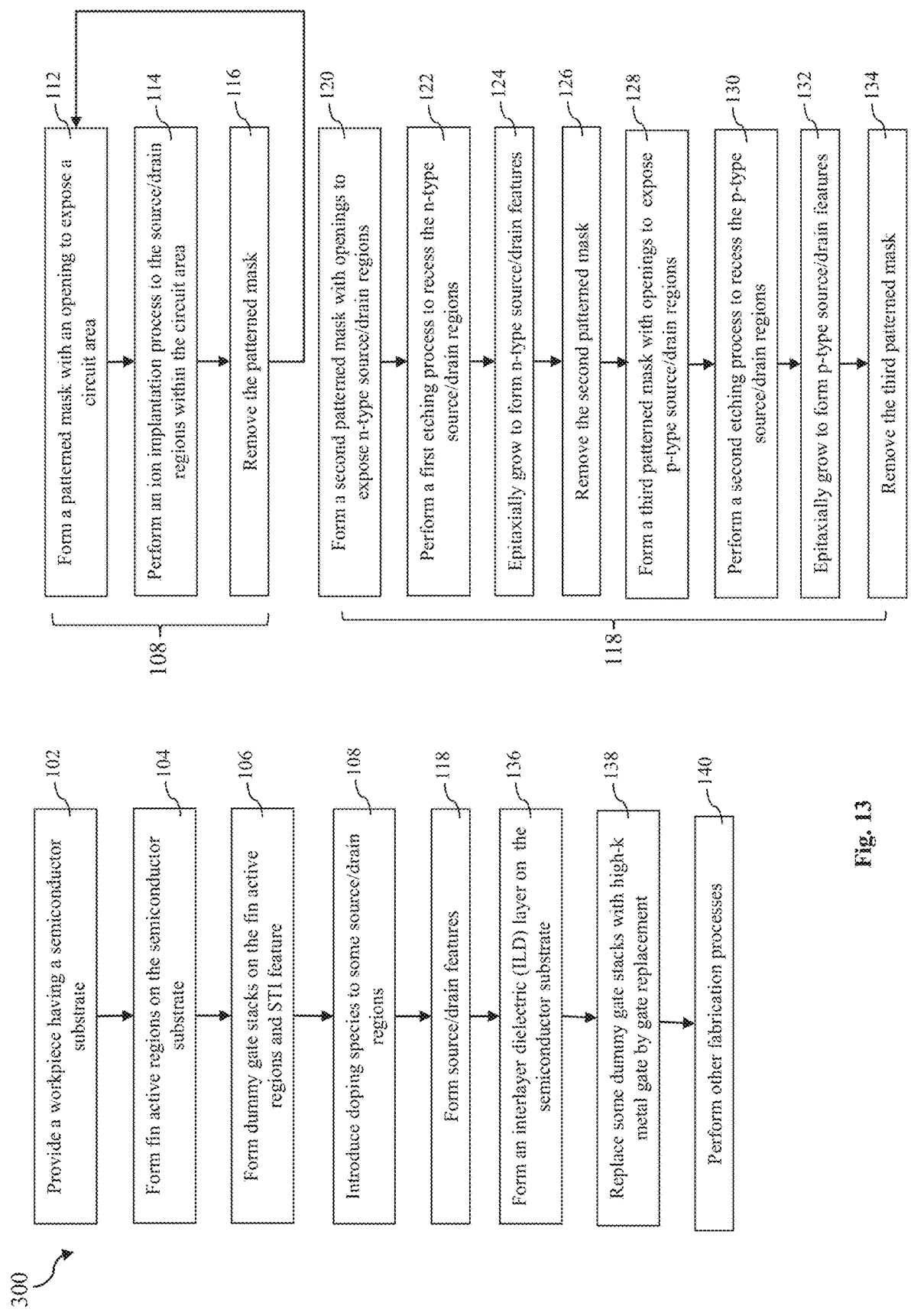
FIG. 13 is a flowchart of a method making a semiconductor structure constructed according to various aspects of the present disclosure in some embodiments.

In some embodiments, multiple ion implantation processes are implemented to introduce the doping species into different circuit areas as illustrated in FIG. 13. FIG. 13 is a flowchart of a method 300 with two or more ion implantation processes applied to treat the source/drain regions in different circuit areas, constructed in accordance with some embodiments. Similar operations are not repeated here for simplicity. In the method 300, the operation 108 (including 112 through 116) is implemented two or more times, each cycle with different patterned mask and different ion implantation dosage.

According to some embodiments of the method 300, in the first cycle 108, the operation 112 includes forming a patterned mask with opening to expose the first circuit area 202A; and the operation 114 includes performing an ion implantation to introduce the etch-enhancing doping species into the source/drain regions within the first circuit area 202A with a first dosage. In the second cycle of the block 108, the operation 112 includes forming a patterned mask with opening to expose the second circuit area 202B; and the operation 114 includes performing an ion implantation to introduce the etch-enhancing doping species into the source/drain regions within the second circuit area 202B with a second dosage less than the first dosage.

In some embodiments of the method 300, in the first cycle 108, the operation 112 includes forming a patterned mask with opening to expose the first circuit area 202A; and the operation 114 includes performing an ion implantation to introduce the etch-enhancing doping species into the source/drain regions within the first circuit area 202A with a first dosage. In the second cycle 108, the operation 112 includes forming a patterned mask with openings to expose the first circuit area 202A and the second circuit area 202B; and the operation 114 includes performing an ion implantation to introduce the etch-enhancing doping species into the source/drain regions within the first circuit area 202A and the second circuit area 202B with a second dosage.

The method 300 may also use the etch-reducing doping species. In some embodiments, in the first cycle 108, the operation 112 includes forming a patterned mask with opening to expose the third circuit area 202C; and the operation 114 includes performing an ion implantation to introduce the etch-reducing doping species into the source/drain regions within the third circuit area 202C with a first dosage. In the second cycle 108, the operation 112 includes forming a patterned mask with opening to expose the second circuit area 202B and the third circuit area 202C; and the operation 114 includes performing an ion implantation to introduce the etch-reducing doping species into the source/drain regions within the second circuit area 202B and the third circuit area 202C with a second dosage.

In some embodiments, the method 300 may perform more than two (such as three) ion implantation processes and use the same number (such as three) low-grade photomasks to form the same number (such as three) patterned masks. For examples, the workpiece 200 includes 4 or more circuit areas, such as 202A, 202B, 202C and 202D, the first patterned mask is formed with an opening to expose the first circuit area 202A and the first ion implantation process is applied to introduce the etch-enhancing species into the source/drain regions in the first circuit area 202A with a first dosage; the second patterned mask is formed with an opening to expose the second circuit area 202B and the second ion implantation process is applied to introduce the etch-enhancing species into the source/drain regions in the second circuit area 202B with a second dosage; and the third patterned mask is formed with an opening to expose the third circuit area 202C and the third ion implantation process is applied to introduce the etch-enhancing species into the source/drain regions in the third circuit area 202C with a third dosage. Three dosages are designed differently to achieve even recessing depth.

In some embodiments, the disclosed method, such as 100 or 300, may be used to form individual source/drain recesses in various circuit areas with desired different depths and corresponding source/drain features with different heights, depending on the circuit specification and circuit performance. For example, the source/drain features of FETs in the second circuit area 202B are desired to have a height greater than those in the first circuit area 202A and the third circuit area 202C. In this case, the method 100 can be used to achieve this. More particularly, the first patterned mask is formed with an opening to expose the second circuit area 202B and the ion implantation process is applied to introduce the etch-enhancing species into the source/drain regions in the second circuit area 202B. In another example, the source/drain features of FETs in the second circuit area 202B are desired to have a height less than those in the first circuit area 202A and the third circuit area 202C. In this case, the method 100 can be used to achieve this. More particularly, the first patterned mask is formed with an opening to expose the second circuit area 202B and the ion implantation process is applied to introduce the etch-reducing species into the source/drain regions in the second circuit area 202B.

In some embodiments, the source/drain features of FETs in various circuit areas are desired to have respective heights. In this case, the method 300 can be used to achieve this. For examples, the workpiece 200 includes 4 or more circuit areas, such as 202A, 202B, 202C and 202D, the first patterned mask is formed with an opening to expose the first circuit area 202A and the first ion implantation process is applied to introduce the etch-enhancing species or the etch-reducing species into the source/drain regions in the first circuit area 202A with a first dosage; the second patterned mask is formed with an opening to expose the second circuit area 202B and the second ion implantation process is applied to introduce the etch-enhancing species or the etch-reducing species into the source/drain regions in the second circuit area 202B with a second dosage; and the third patterned mask is formed with an opening to expose the third circuit area 202C and the third ion implantation process is applied to introduce the etch-enhancing species or the etch-reducing species into the source/drain regions in the third circuit area 202C with a third dosage. Three dosages are tuned differently to achieve respective recessing depths.

Figure 14:
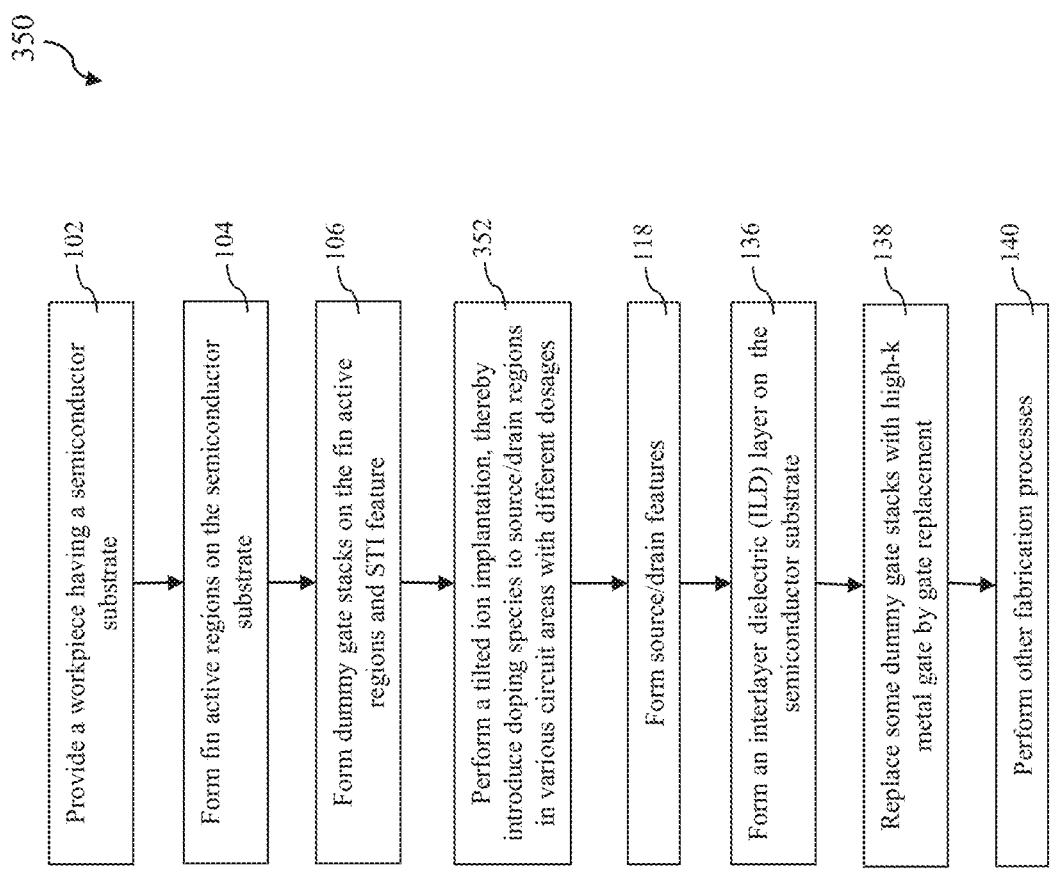
FIG. 14 is a flowchart of a method making a semiconductor structure constructed according to various aspects of the present disclosure in some embodiments.
Figure 15A:
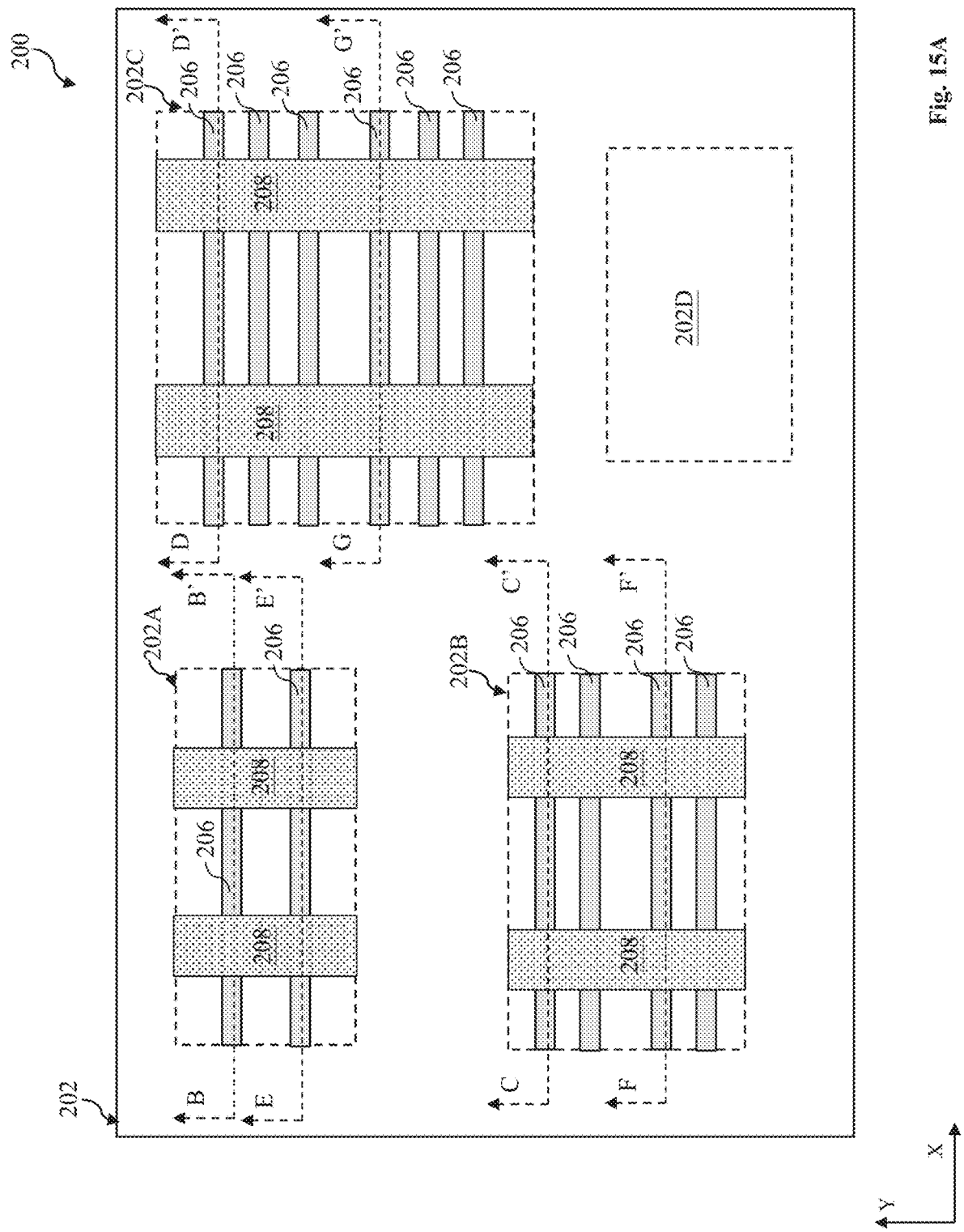
FIG. 15A is a top view of a semiconductor structure constructed according to some embodiments.

In some embodiments, the ion implantation is applied to various circuit areas with different respective dosages without using a patterned mask, thereby compensating the variation of the etch rate among various circuit areas during the etching process to recess the source/drain regions. The method is further described with reference to FIGS. 14 and 15A through 15G. FIG. 14 is a flowchart of a method 350 constructed in accordance with some embodiments. FIG. 15A is a top view and FIGS. 15B-15G are sectional views of the workpiece 200 of FIG. 15A along BB', CC', DD', EE', FF' and GG' of the workpiece 200, respectively, in portion, constructed according to some embodiments.

The method 350 is similar to the method 100 except for the operation to introduce the doping species into the source/drain regions. Similar operations are not repeated for simplicity. Instead of the operation 108 using the first patterned mask 214, the method 300 includes an operation 352 by performing a tilted ion implantation process 250 to the source/drain regions 216 in various circuit areas without using a patterned mask. Since no patterned mask is used during the ion implantation process, the ion implantation process is applied to all the circuit areas, such as 202A, 202B, 202C and 202D. However, the ion implantation process 250 is designed to introduce the etch-reducing species to the source/drain regions 216 in various circuit areas with different dosages, which is achieved by implantation loading effect as described below. The ion implantation process 250 is a tilted ion implantation process, in which the ion is implanted into the source/drain regions 216 with a tilted angle. As the gate spacings in different circuit areas are different, the tilted ion implantation directs the doping species to the source/drain regions 216 with the tilted angle, portions of the doping species are shielded by the gate structures 208, depending on the gate height H and the gate spacing S. For illustration, in an extreme case where the tilted angle is greater than $\theta$ and $\tan(\theta)=S/W$, the doping species cannot reach to the corresponding source/drain regions. When the tilted angle is less than $\theta$, only a fraction amount of the doping species can reach the corresponding source/drain regions 216. For a given tilted angle, a source/drain region in a circuit area with less gate spacing will receive less amount of the doping species per unit area; and a source/drain region in a circuit area with greater gate spacing will receive greater amount of the doping species per unit area. This is referred to as implantation loading effect. When the doping species reduces is the etch-reducing species, the etch rate of the source/drain regions 216 in a circuit area with a greater gate spacing is decreased when the etch-reducing species is introduced into the source/drain regions by the tilted ion implantation process due to the implantation loading effect, which can compensate the variation of the etch rate caused by the etch loading effect. When the tilted angle is properly determined according to the ratios S/W for various circuit areas and the etch loading effect, the etch rate variation is substantially reduced or eliminated to achieve uniform recess during the etching process to recess the source/drain regions. The tilted angle can be determined using the manufacturing data and design date, or alternatively or additionally using a feedforward mechanism. For example, the initial tilted angle is determined according to the ratios S/W from the design data and the etch loading effect from the manufacturing date. Thereafter, extract the variation of the gate height from processed wafers to adjust the tilted angle to the following wafers to be processed such that the variation of the gate height is minimized.

In the depicted embodiment, the tilted ion implantation process 250 is performed while the workpiece 200 is rotating around the axis perpendicular to the substrate 202 so that the source/drain regions 216 are evenly doped by the etch-reducing species.

The present disclosure provides a method to form source/drain features for a workpiece with various circuit areas that include FETs having different structure and configurations. During the formation of source/drain features, the source/drain regions are recessed by an etching process and the source/drain features are epitaxially grown in the source/drain recesses. Due to different dimensions and structures of FETs in various circuit areas and the etch loading effect, the recess depth varies among different circuit areas. Especially, one or more ion implantation is performed to treat a subset of the source/drain regions and tune the etch rate thereof, therefore compensating the variation of etch rate of the etching process to recess the source/drain regions. It is understood that different embodiments disclosed herein offer different advantages and that no particular advantage is necessarily required in all embodiments. By utilizing the disclosed method, the source/drain recesses can achieve comparable depths or a uniform depth to satisfy the varied device optimization for Power-Performance-Area-Cost (PPAC) requirements. By utilizing the disclosed method, it can also intentionally create varied source/drain depth on devices within different circuit areas with varied back-end of line (BEOL) resistance/capacitance (R/C) weighting for circuit optimization, such as direct current (DC) performance and ring oscillator (RO) performance boost based on circuit layout.

By utilizing the disclosed method with implantation-enhanced strain source/drain (i-SSD), it can achieve additional cost saving with simplified lithography. In various embodiments, less number of photomasks are used and some of these photomasks are low-grade photomasks with reduced manufacturing cost. As one example, one ion implantation is performed using a patterned mask and a low-grade photomask, as described in the method 100 and its alternatives. Instead of individually recessing the source/drain (S/D) regions, which needs more lithography processes and more high-grade photomasks (such as 4 high-grade photomasks to tune two different circuit areas: nFET S/D regions in the first circuit area, pFET S/D regions in the first circuit area, nFET S/D regions in the second circuit area, and pFET S/D regions in the second circuit area), the method 100 only needs three lithography processes and three photomasks: one low-grade photomask for ion implantation and two high-grade photomasks for pFET S/D regions and nFET S/D regions. In another example, ion implantation is performed twice using patterned masks and two low-grade photomasks, as described in the method 300 and its alternatives. Instead of individually recessing the S/D regions, which needs 6 lithography processes and 6 high-grade photomasks, the method 300 only needs 4 lithography processes and 4 photomasks: two low-grade photomasks for two ion implantation processes and two high-grade photomasks for pFET S/D regions and nFET S/D regions. In another example, one ion implantation is performed without using patterned mask, as described in the method 350. The method 300 only needs two lithography processes and 2 two high-grade photomasks for pFET S/D regions and nFET S/D regions.

The disclosed method is not only applicable to the FinFETs and is also applicable to other circuit structure, such as planar FET structure or three-dimensional FET structure having multiple channels vertically stacked, such as GAA structure.

In one example aspect, the present disclosure provides a fabrication method that includes providing a workpiece having a semiconductor substrate that includes a first circuit area and a second circuit area; forming a first active region in the first circuit area and a second active region on the second circuit area; forming first stacks with a first gate spacing on the first active region and second gate stacks with a second gate spacing on the second active region, the second gate spacing being different from the first gate spacing; performing an ion implantation to introduce a doping species to the first active region; performing an etching process, thereby recessing both first source/drain regions of the first active region with a first etch rate and second source/drain regions of the second active region; and epitaxially growing first source/drain features within the first source/drain regions and second source/drain features within the second source/drain regions.

In another example aspect, the present disclosure provides a fabrication method that includes providing a workpiece having a semiconductor substrate that includes a first circuit area and a second circuit area; forming a first active region in the first circuit area and a second active region on the second circuit area; forming first stacks with a first gate spacing on the first active region and second gate stacks with a second gate spacing on the second active region, the second gate spacing being different from the first gate spacing; performing an ion implantation to introduce a doping species to the first active region; performing an etching process, thereby recessing both first source/drain regions of the first active region with a first etch rate and second source/drain regions of the second active region; and epitaxially growing first source/drain features within the first source/drain regions and second source/drain features within the second source/drain regions.

In yet another example aspect, the present disclosure provides a fabrication method that includes providing a workpiece having a semiconductor substrate with a first circuit area, a second circuit area, and a third circuit area; forming a first active region within the first circuit area, a second active region within the second circuit area, and a third active region within the third circuit area; forming first gate stacks on the first active region, second gate stacks on the second active region, and third gate stacks on the third active region, wherein the first gate stacks have a first gate spacing, the second gate stacks have a second gate spacing greater than the first gate spacing, and the third gate stacks have a third gate spacing greater than the second gate spacing; forming a first patterned mask covering the second and third active regions; introducing a doping species to the first active region while second and third active regions are covered by the first patterned mask; performing an etching process, thereby recessing first source/drain regions of the first active region, second source/drain regions of the second active region, and third source/drain regions of the third active region; and performing an epitaxial growth, thereby forming first source/drain features within the first source/drain regions, second source/drain features within the second source/drain regions, and third source/drain features within the third source/drain regions.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    providing a workpiece having a semiconductor substrate with a first circuit area and a second circuit area;
    forming a first active region within the first circuit area and a second active region within the second circuit area;
    forming a first gate structure on the first active region and a second gate structure on the second active region;
    introducing a doping species to the first active region but not the second active region;
    performing an etching process, thereby simultaneously recessing both first source/drain regions of the first active region and second source/drain regions of the second active region at a same etch rate; and
    thereafter, epitaxially growing first source/drain features within the first source/drain regions and second source/drain features within the second source/drain regions.

2. The method of claim 1, wherein the first gate structure has first gate stacks with a first gate spacing and the second gate structure has second gate stacks with a second gate spacing different from the first gate spacing.

3. The method of claim 2, wherein the second gate spacing is greater than the first gate spacing, and the doping species is an etch-enhancing species.

4. The method of claim 3, wherein the doping species includes one of carbon (C), silicon (Si), germanium (Ge), hydrogen (H), nitrogen (N), fluorine (F), argon (Ar), gallium (Ga), phosphorous (P), arsenic (As), and a combination thereof.

5. The method of claim 1, wherein the first circuit area includes a high scaling device and the second circuit area includes at least one of a high-speed device and an I/O device.

6. The method of claim 1, before introducing the doping species, the method further comprising forming a patterned mask covering the second active region,
    wherein the forming of the patterned mask includes performing a lithography process using a low-grade photomask.

7. The method of claim 1, wherein the doping species is a first doping species, the method further comprising:
    introducing a second doping species to the second active region but not the first active region.

8. A method, comprising:
    providing a workpiece having a semiconductor substrate that includes a first circuit area and a second circuit area;
    forming a first active region in the first circuit area and a second active region on the second circuit area;
    forming first gate stacks with a first gate spacing on the first active region and second gate stacks with a second gate spacing on the second active region, the second gate spacing being different from the first gate spacing;
    performing an ion implantation to introduce a doping species to the first active region with a first dosage and to the second active region with a second dosage different from the first dosage; and
    forming first source/drain features within first source/drain regions of the first active region and second source/drain features within second source/drain regions of the second active region.

9. The method of claim 8, wherein forming the first source/drain features within the first source/drain regions of the first active region and the second source/drain features within the second source/drain regions of the second active region includes:
    performing an etching process, thereby recessing both the first source/drain regions of the first active region and the second source/drain regions of the second active region; and
    epitaxially growing the first source/drain features within the first source/drain regions and the second source/drain features within the second source/drain regions.

10. The method of claim 8, wherein the doping species includes one of gallium (Ga), phosphorous (P), arsenic (As) and a combination thereof.

11. The method of claim 8, wherein the doping species includes one of carbon (C), silicon (Si), germanium (Ge), hydrogen (H), nitrogen (N), fluorine (F), argon (Ar), gallium (Ga), phosphorous (P), arsenic (As), and a combination thereof.

12. The method of claim 8, wherein performing the ion implantation includes performing an angled ion implantation with a tilted angle.

13. The method of claim 12, wherein performing an etching process includes performing the etching process to the first source/drain regions and the second source/drain regions with respective etch rates to compensate an etch loading effect caused by different gate spacings.

14. The method of claim 12, wherein during the performing of the ion implantation, the workpiece is rotating around an axis perpendicular to the semiconductor substrate.

15. The method of claim 8, wherein performing the ion implantation includes:
forming a patterned mask with an opening to expose the first circuit area;
performing a first ion implantation to introduce the doping species into the first source/drain regions within the first circuit area;
forming a patterned mask with openings to expose the first circuit area and the second circuit area; and
performing a second ion implantation to introduce the doping species into the first source/drain regions within the first circuit area and the second source/drain regions within the second circuit area.

16. A method, comprising:
providing a workpiece having a semiconductor substrate with a first circuit area, a second circuit area, and a third circuit area;
forming a first active region within the first circuit area, a second active region within the second circuit area, and a third active region within the third circuit area;
forming first gate stacks on the first active region, second gate stacks on the second active region, and third gate stacks on the third active region, wherein the first gate stacks, the second gate stacks, and the third gate stacks have gate spacings different from each other;
introducing a doping species to the first active region; and
forming first source/drain features within the first source/drain regions, second source/drain features within the second source/drain regions, and third source/drain features within the third source/drain regions.

17. The method of claim 16, before introducing a doping species, the method further comprising forming a patterned mask covering the second and third active regions.

18. The method of claim 16, wherein the first gate stacks and the first source/drain features constitute high scaling field effect transistors (FETs) within the first circuit area, the second gate stacks and the second source/drain features constitute high-speed FETs within the second circuit area, and the third gate stacks and the third source/drain features constitute I/O FETs within the third circuit area.

19. The method of claim 16, wherein introducing the doping species further includes introducing the doping species to the second active region and the third active region.

20. The method of claim 19, wherein introducing the doping species to the first active region, the second active region, and the third active region is with different dosages.

* * * * *